United States Patent
Kawai et al.

(10) Patent No.: US 10,663,524 B2
(45) Date of Patent: May 26, 2020

(54) BATTERY STATE ESTIMATING APPARATUS

(71) Applicant: DENSO CORPORATION, Kariya, Aichi-pref. (JP)

(72) Inventors: Toshiyuki Kawai, Kariya (JP); Keiichi Kato, Kariya (JP); Yuuji Koike, Kariya (JP)

(73) Assignee: DENSO CORPORATION, Kariya (JP)

( * ) Notice: Subject to any disclaimer, the term of this patent is extended or adjusted under 35 U.S.C. 154(b) by 331 days.

(21) Appl. No.: 15/556,138

(22) PCT Filed: Mar. 7, 2016

(86) PCT No.: PCT/JP2016/056932

§ 371 (c)(1),
(2) Date: Sep. 6, 2017

(87) PCT Pub. No.: WO2016/143728

PCT Pub. Date: Sep. 15, 2016

(65) Prior Publication Data

US 2018/0045788 A1     Feb. 15, 2018

(30) Foreign Application Priority Data

Nov. 26, 2015  (JP) .................................. 2015-231112

(51) Int. Cl.
   *G01R 31/36* (2020.01)
   *H01M 10/42* (2006.01)
   (Continued)

(52) U.S. Cl.
   CPC ...... *G01R 31/367* (2019.01); *H01M 10/4285* (2013.01); *H01M 10/482* (2013.01); *G01R 31/389* (2019.01); *H01M 2220/20* (2013.01)

(58) Field of Classification Search
   CPC ............... G01R 31/367; G01R 31/389; H01M 10/4285; H01M 2220/20
   See application file for complete search history.

(56) References Cited

U.S. PATENT DOCUMENTS

| 2010/0153038 A1 | 6/2010 | Tomura et al. | |
| 2015/0355283 A1* | 12/2015 | Lee | G01R 31/3842 |
| | | | 702/63 |
| 2016/0039419 A1* | 2/2016 | Wampler | B60W 10/26 |
| | | | 701/22 |

FOREIGN PATENT DOCUMENTS

| JP | 2003-075518 A | 3/2003 |
| JP | 2009-103471 A | 5/2009 |

(Continued)

OTHER PUBLICATIONS

May 17, 2016 Search Report issued in International Patent Application No. PCT/JP2016/056932.

*Primary Examiner* — Manuel L Barbee
(74) *Attorney, Agent, or Firm* — Oliff PLC

(57) ABSTRACT

A battery state estimating apparatus includes an updating unit. The updating unit updates a charge-transfer impedance model in a battery model of a secondary battery, which is a series connection of a DC resistance model, a charge-transfer impedance model, and an diffusion impedance model, using the amount of change in a measurement value of a current flowing through the secondary such that a first relationship between the current flowing through the secondary battery and a voltage across the charge-transfer resistance approaches a second relationship between an actual value of the current and an actual value of the voltage across the charge-transfer resistance. The first relationship between the current flowing through the secondary battery and the voltage across the charge-transfer resistance is defined based on the Butler-Volmer equation. A state estimator estimates a state of the secondary battery based on the battery model including the updated charge-transfer impedance model.

15 Claims, 10 Drawing Sheets

(51) Int. Cl.
*G01R 31/367* (2019.01)
*H01M 10/48* (2006.01)
*G01R 31/389* (2019.01)

(56) References Cited

FOREIGN PATENT DOCUMENTS

| | | |
|---|---|---|
| JP | 2011-122951 A | 6/2011 |
| JP | 2012-159414 A | 8/2012 |
| JP | 2017-040574 A | 2/2017 |

\* cited by examiner

BATTERY STATE ESTIMATING APPARATUS

TECHNICAL FIELD

The present invention relates to apparatuses for estimating the state of a secondary battery based on an equivalent circuit model of the secondary battery.

BACKGROUND ART

There is an apparatus for estimating the state of a secondary battery, which is disclosed in patent document 1. The apparatus disclosed in patent document 1 estimates values of parameters representing a model of a secondary battery using an adaptive digital filter; the model is expressed as an equivalent circuit comprised of a single resistor and a single RC parallel circuit connected in series to the resistor.

Then, the apparatus estimates the state of charge of the secondary battery based on the estimated values of the parameters.

CITATION LIST

Patent Document

[Patent Document 1] Japanese Patent Application Publication No. 2003-75518

SUMMARY OF INVENTION

Technical Problem

Common secondary batteries have current-voltage characteristics that nonlinearly change in a low-temperature region of the secondary batteries.

Unfortunately, the above structure of the battery model disclosed in patent document 1 may have difficulty in expressing the current-voltage characteristics of the secondary battery when the current-voltage characteristics nonlinearly change, because the time constant of the RC parallel circuit is small.

In particular, the level of the nonlinearly change of the current-voltage characteristics may become too large to ignore at temperatures of the secondary battery below 0 degrees. The battery model disclosed in patent document 1 may therefore reduce the accuracy of estimating the state of secondary battery in the low temperature regions.

The present invention mainly aims to provide battery state estimating apparatuses, each of which is capable of preventing reduction of the estimation accuracy of the state of a secondary battery even in a low-temperature region of the secondary battery.

Means for Solving Problem

A battery state estimating apparatus according to an exemplary aspect of the present invention includes an updating unit. The updating unit is configured to perform a task of updating a charge-transfer impedance model included in a battery model of a secondary battery (20a) in accordance with an amount of change in a measurement value of a current flowing through the secondary battery. The battery model includes a DC resistance model representing a DC resistance of the secondary battery, and the charge-transfer impedance model representing a charge-transfer impedance of the secondary battery and including a charge-transfer resistance parameter ($\beta$) that is correlated with an exchange current density. The charge-transfer impedance model is derived from the Butler-Volmer equation. The battery model includes a diffusion impedance model being an RC equivalent circuit model including a parallel circuit that includes a resistance and a capacitance connected in parallel to each other. The diffusion impedance model represents a diffusion impedance of the secondary battery. The DC resistance model, the charge-transfer impedance model, and the diffusion impedance model are connected in series to each other. The task of updating the transfer impedance model is configured to cause a first relationship between the current flowing through the secondary battery and a voltage across the charge-transfer resistance to approach a second relationship between an actual value of the current flowing through the secondary battery and an actual value of the voltage across the charge-transfer resistance. The first relationship between the current flowing through the secondary battery and the voltage across the charge-transfer resistance is defined based on the Butler-Volmer equation. The battery state estimating apparatus includes a state estimator (30) configured to estimate a state of the secondary battery based on the battery model including the updated charge-transfer impedance model.

The internal impedance of a secondary battery includes basically a DC resistance, a charge-transfer impedance, and a diffusion impedance. For this reason, the battery model according to the exemplary aspect is defined as a model including a DC resistance model, a charge-transfer impedance model, and a diffusion impedance model connected in series to each other.

At low temperatures, the nonlinear current-voltage characteristics of a secondary battery due to the charge-transfer impedance are dominant. For this reason, the exemplary aspect of the present invention uses, as the charge-transfer impedance model, the model, which is derived from the Butler-Volmer equation and expresses the nonlinear characteristics of the secondary battery. Specifically, this model includes the charge-transfer resistance parameter corresponding to the exchange current density in the Butler-Volmer equation, and having correlation with the temperature of the secondary battery. Because the charge-transfer resistance parameter depends on the temperature of the secondary battery, the exemplary aspect of the present invention enables the nonlinear current-voltage characteristics of the secondary battery, which cannot be expressed by the technology disclosed in, for example, the above patent document 1, to be expressed with higher accuracy.

The charge-transfer resistance parameter may change due to deterioration of the corresponding secondary battery, or may be shifted from its suitable value due to an error in the charge-transfer impedance model or a temperature-measurement error. In addition, there are variations in the charge-transfer resistance parameters due to the individual differences of the corresponding secondary batteries. This may result in a reduction of the estimation accuracy of the state of the secondary battery based on the above battery model.

To address this concern, the updating unit of the battery state estimating apparatus according to the exemplary aspect of the present invention updates the charge-transfer impedance model in accordance with the amount of change in the measurement value of the current flowing through the secondary battery to cause the first relationship between the current flowing through the secondary battery and the voltage across the charge-transfer resistance to approach the second relationship, i.e. an actual relationship, between the actual value of the current flowing through the secondary battery and the actual value of the voltage across the charge-transfer resistance. The first relationship between the current flowing through the secondary battery and the voltage across the charge-transfer resistance is defined based on the Butler-Volmer equation.

The relationship between the current flowing through the secondary battery and the voltage across the charge-transfer resistance depends on the charge-transfer resistance parameter. For this reason, updating the charge-transfer impedance model enables the deviation of the charge-transfer resistance parameter used to estimate the state of the secondary battery from its actual value to be reduced. The exemplary aspect of the present invention estimates the state of the secondary battery based on the battery model including the updated charge-transfer impedance model. This prevents reduction in the estimation accuracy of the state of the secondary battery based on the battery model.

Specifically, the updating unit of the battery state estimating apparatus according to the exemplary aspect of the present invention is configured to estimate the charge-transfer impedance model at a predetermined calculation period, and the state estimator of the battery state estimating apparatus is configured to estimate the state of the secondary battery at the predetermined calculation period.

The battery state estimating apparatus according to the exemplary aspect of the present invention can include the following specific structure. Specifically, the specific structure includes a first deviation calculator (30) configured to calculate, as a first deviation, a deviation between a measurement value of the current flowing through the secondary battery at a present calculation period and a measurement value of the current flowing through the secondary battery at an immediately previous calculation period, and a second deviation calculator (30). The second deviation calculator is configured to calculate, as a second deviation, any one of 1. An estimation-current deviation between an estimation current flowing through the secondary battery and being estimated from the charge-transfer impedance model at the present calculation period, and an estimation current flowing through the secondary battery and being estimated from the charge-transfer impedance model at the immediately previous calculation period 2. A value depending on the estimation current deviation.

The specific structure also includes a parameter estimator (30) configured to estimate, based on the first and second deviations, a correction coefficient ($\beta_k$) for causing the second deviation to approach the first deviation in accordance with a method of iterative least squares.

At that time, the updating unit is configured to perform, as the task of updating the charge-transfer resistance parameter, a task of updating, based on the correction coefficient estimated by the parameter estimator, the charge-transfer resistance parameter.

The battery state estimating apparatus according to the exemplary aspect of the present invention is capable of calculating the first deviation between the measurement value of the current flowing through the secondary battery at the present calculation period and the measurement value of the current flowing through the secondary battery at the immediately previous calculation period. The battery state estimating apparatus according to the exemplary aspect of the present invention is also capable of calculating, as the second deviation, any one of 1. The estimation current deviation between an estimation current flowing through the secondary battery and being estimated from the charge-transfer impedance model at the present calculation period, and the estimation current flowing through the secondary battery and being estimated from the charge-transfer impedance model at the immediately previous calculation period 2. The value depending on the estimation current deviation.

Because the DC resistance model, the charge-transfer model, and the diffusion impedance model are connected in series to each other, the second deviation is close to the first deviation if there is no deterioration in the secondary battery, or there is no error in the charge-transfer impedance model. In contrast, there is a great deviation between the first and second deviations if the secondary battery has deviated, or if there is an error in the charge-transfer impedance model.

For addressing such concern, the battery state estimating apparatus according to the exemplary aspect of the present invention is capable of estimating, based on the first and second deviations, the correction coefficient for causing the second deviation to approach the first deviation in accordance with the method of iterative least squares. This enables the battery state estimating apparatus to correct the charge-transfer resistance parameter based on the estimated correction coefficient.

This results in the error in the charge-transfer impedance model decreasing even if there is a read error of the charge-transfer resistance parameter due to the deterioration of the secondary battery or the temperature measurement error. This therefore prevents reduction in the estimation accuracy of the state of the secondary battery based on the battery model.

In the battery state estimating apparatus according to the exemplary aspect of the present invention, the charge-transfer impedance model expresses the nonlinear current-voltage characteristics with high accuracy. For this reason, the opportunity to estimate the correction coefficient is not restricted to the situation where the magnitude of the current flowing through the secondary battery is 0 A or thereabout. That is, it is possible to estimate the correction coefficient independently of the magnitude of the current flowing through the secondary battery.

In the battery state estimating apparatus according to the exemplary aspect of the present invention, the Butler-Volmer equation includes a first coefficient ($\gamma_v$) for defining scaling-up or scaling-down in the direction of the charge-transfer resistance voltage in the Butler-Volmer equation, and a second coefficient ($\gamma_i$) for defining scaling-up or scaling-down in the direction of the current flowing through the battery cell in the Butler-Volmer equation. The battery state estimating apparatus includes a first identifier (30) configured to identify, based on the amount of change in the measurement value of the current flowing through the secondary battery and the amount of change in a voltage across the secondary battery, the charge-transfer resistance parameter as a correlation value of the gradient of a primary expression in accordance with the method of iterative least squares on condition that the absolute value of the measurement value of the current flowing through the secondary battery is lower than a predetermined threshold. The primary expression defines the first relationship between the current flowing through the secondary battery and the voltage across the charge-transfer resistance. The battery state estimating apparatus includes a second identifier (30) configured to identify, based on the amount of change in the measurement value of the current flowing through the secondary battery and the amount of change in the voltage across the secondary battery, the first identifier at a calculation period in accordance with the method of iterative least squares. The second identifier is configured to apply the identified first coefficient to the second coefficient at the next calculation period immediately after the calculation period at which the first identifier was identified. At that time, the updating unit is configured to perform, as the task of updating, the task of updating the charge-transfer impedance model as a function of both the charge-transfer resistance parameter identified by the first identifier, and the first and second coefficients identified by the second identifier.

The relationship between the current flowing through the secondary battery and the voltage across the charge-transfer resistance can be approximated by a primary expression having one of the current flowing through the secondary battery and the voltage across the charge-transfer resistance as an independent variable, and having the other as a dependent variable. In this case, the gradient of the primary expression has correlation with the charge-transfer resistance parameter. The gradient of the primary expression can be calculated based on the amount of change in the current flowing through the secondary battery and the amount of change in the voltage across the secondary battery.

From this viewpoint, the battery state estimating apparatus according to the exemplary aspect of the present invention identifies, based on the amount of change in the measurement value of the current flowing through the secondary battery and the amount of change in the voltage across the secondary battery, the charge-transfer resistance parameter as the correlation value of the gradient of the primary expression in accordance with the method of iterative least squares on condition that the absolute value of the measurement value of the current flowing through the secondary battery is lower than the predetermined threshold. The primary expression defines the first relationship between the current flowing through the secondary battery and the voltage across the charge-transfer resistance.

On the other hand, the Butler-Volmer equation includes the first coefficient for defining scaling-up or scaling-down in the direction of the charge-transfer resistance voltage in the Butler-Volmer equation, and the second coefficient for defining scaling-up or scaling-down in the direction of the current flowing through the battery cell in the Butler-Volmer equation. Each of the first and second coefficients may also change due to deterioration of the corresponding secondary battery, or may be shifted from its suitable value due to an error in the charge-transfer impedance model or a temperature-measurement error. In addition, there are variations in each of the first and second coefficients due to the individual differences of the corresponding secondary batteries.

From this viewpoint, the battery state estimating apparatus according to the exemplary aspect of the present invention identifies, based on the amount of change in the measurement value of the current flowing through the secondary battery and the amount of change in the voltage across the secondary battery, the first identifier at a calculation period in accordance with the method of iterative least squares. Then, the battery state estimating apparatus applies the identified first coefficient to the second coefficient at the next calculation period immediately after the calculation period at which the first identifier was identified. This therefore prevents reduction in the estimation accuracy of the state of the secondary battery based on the battery model.

DESCRIPTION OF EMBODIMENT

First Embodiment

Figure 1:
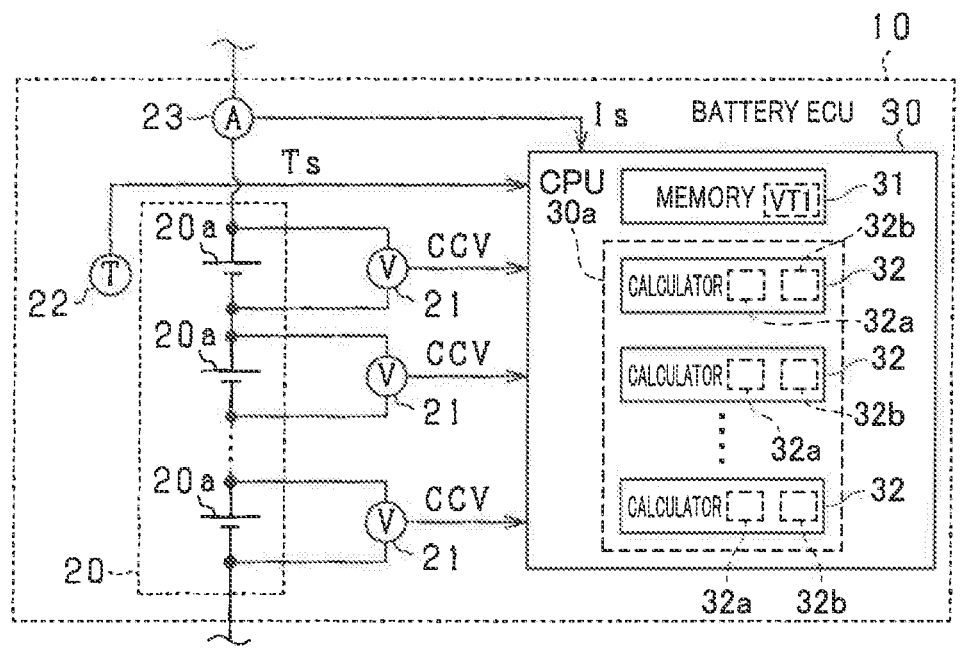
FIG. 1 is a block diagram illustrating the structure of a battery system according to the first embodiment of the present invention.

The following describes the first embodiment of the present disclosure with reference to the accompanying drawings. In the drawings, like reference characters are used to identify corresponding like parts.

FIG. 1 illustrates a battery system 10 according to the first embodiment of the present invention. The battery system 10 incorporates an apparatus for estimating parameters indicative of the state of a secondary battery, i.e. a battery pack 20. Note that the battery system 10 is capable of supplying power from the battery pack 20 to external devices; the external devices include, for example, a vehicle equipped with a rotary electric machine, i.e. a motor-generator, serving as a main engine of the vehicle. The battery system 10 also serves as an auxiliary battery system installed in a vehicle equipped with an idle reduction system using an auxiliary battery.

Referring to FIG. 1, the battery system 10 includes the battery pack 20 and a battery electronic control unit (ECU) 30. The battery pack 20 includes a plurality of battery cells 20a connected in series to each other. The battery pack 20 is connected to electrical loads including a power generator, such as a motor-generator. The battery pack 20 is capable of supplying power to the electrical loads, and receiving power supplied therefrom. The first embodiment uses a rechargeable battery cell, such as a lithium-ion secondary battery cell, as each battery cell 20a.

As skilled persons in the art know well, each of the battery cells 20a schematically includes a positive electrode, a negative electrode, an electrolyte, and a separator separating the positive electrode and the negative electrode in the electrolyte. Electrochemical reactions take place in the electrolyte of the corresponding battery cell, resulting in a current flowing through the electrical loads connected to the battery pack 20.

The above-configured battery cell 20a inherently has internal impedance.

The internal impedance includes, for example, direct-current (DC) impedance, charge-transfer impedance, and diffusion impedance.

The DC impedance includes the resistances of the positive and negative electrodes and the resistance of the electrolyte of the battery cell 20a.

The charge-transfer impedance includes a pair of a charge-transfer resistance, and an electric double layer capacitance connected in parallel to the charge-transfer resistance. The charge-transfer resistance and the electric double layer capacitance are based on, for example, ions, i.e. lithium ions, in the electrolyte and electrical charges in the positive electrode at their interface, and reactions between ions in the electrolyte and electrical charges in the negative electrode at their interface.

The diffusion impedance includes a diffusion resistance and a diffusion capacitance connected in parallel to the diffusion resistance. The diffusion resistance and the diffusion capacitance are based on, for example, diffusion of ions in the electrolyte and diffusions of ions in the active material of each of the positive and negative electrodes. The diffusion capacitance expresses the change of the diffusion resistance over time.

The battery system 10 also includes a plurality of voltage sensors 21, a temperature sensor 22, and a current sensor 23, which are examples of various sensors capable of measuring various physical characteristics of the battery pack 20.

Each of the voltage sensors 21 is configured to measure a voltage CCV across a corresponding one of the battery cells 20a, and output a measurement signal indicative of the voltage CCV across a corresponding one of the battery cells 20a to the battery ECU 30. The voltage CCV across a battery cell 20a will also be referred to as a terminal voltage CCV across the battery cell 20a. The temperature sensor 22 is configured to detect a temperature Ts of the battery pack 20, i.e. a temperature Ts of each battery cell 20a, and output a measurement signal indicative of the temperature Ts, which will be referred to as a cell temperature Ts, of each battery cell 20a to the battery ECU 30. The current sensor 23 is configured to measure a current Is flowing through the battery pack 20 (each battery cell 20a), and output a measurement signal indicative of the measured current Is to the battery ECU 30.

Note that the polarity of the measured current Is is set to be negative when the measured current Is is flowing out of the battery pack 20 so that the battery cell 20a is discharged, and to be positive when the measured current Is is flowing into the battery pack 20 so that the battery cell 20a is charged.

The battery ECU 30 includes, for example, a well-known microcomputer, which is comprised of, for example, a CPU 30a, a storage, i.e. a memory, 31, an unillustrated I/O interfaces, and other peripheral devices. The memory 31 stores information VTI correlating with various characteristic parameters of the battery pack 20.

The CPU 30a includes a plurality of calculators 32 respectively corresponding to the battery cells 20a. To the battery ECU 30, the measurement signals sent from the voltage sensors 20, temperature sensor 21, and current sensor 22 are input.

Each calculator 32 according to the first embodiment performs

1. A state of charge calculating routine that calculates the state of charge of the corresponding battery cell 20a 2. First and second learning routines, which are characteristic structures of the first embodiment The following describes the state of charge calculating routine, the first learning routine, and the second learning routine in this order.

1. State of Charge Calculating Routine

Figure 2:
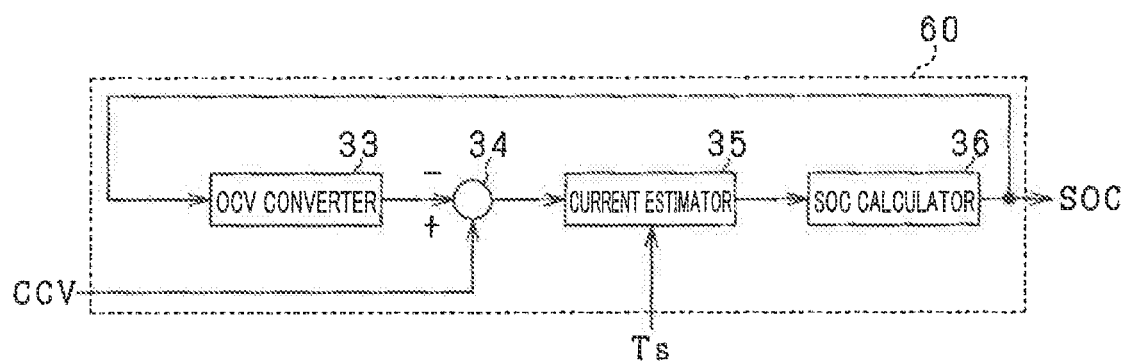
FIG. 2 is a block diagram illustrating an SOC calculating routine in the battery system illustrated in FIG. 1.

The following describes the state of charge calculating routine carried out by each calculator 32 for the corresponding battery cell 20a in accordance with FIG. 2.

Each calculator 32 includes, as a state estimator 60 for performing the state of charge calculating routine, an OCV converter 33, a voltage deviation calculator 34, a current estimator 35, and an SOC calculator 36.

The OCV converter 33 calculates an open circuit voltage OCV across the battery cell 20a in accordance with the state of charge (SOC) of the battery cell 20a, which was calculated by the SOC calculator 36 described hereinafter in the immediately previous calculation period. The OCV converter 33 according to the first embodiment uses an OCV map in which the SOC and the open circuit voltage OCV are previously correlated with each other to correspondingly calculate a value of the open circuit voltage OCV of the corresponding battery cell 20a. The OCV map according to the first embodiment is stored in the memory 31 as a part of the information VTI.

The voltage deviation calculator 34 subtracts, from the terminal voltage CCV across the battery cell 20a measured by the voltage sensor 21, the open circuit voltage OCV calculated by the OCV converter 33, thus outputting a value based on the subtraction. The current estimator 35 estimates, based on the output value of the voltage deviation calculator 34 and the temperature of the battery cell 20a measured by the temperature sensor 22, which will be referred to as a cell temperature Ts, a current flowing through the battery cell 20a.

The following describes a current estimation method by the current estimator 35.

First, the following describes an equivalent circuit model, i.e. a battery model, 38 that equivalently simulates the electrochemical behavior of the battery cell 20a used by the current estimator 35 for estimating a current flowing through the battery cell 20a. That is, the battery model 38 expresses, for example, the internal impedance of the battery cell 20a.

Figure 3:
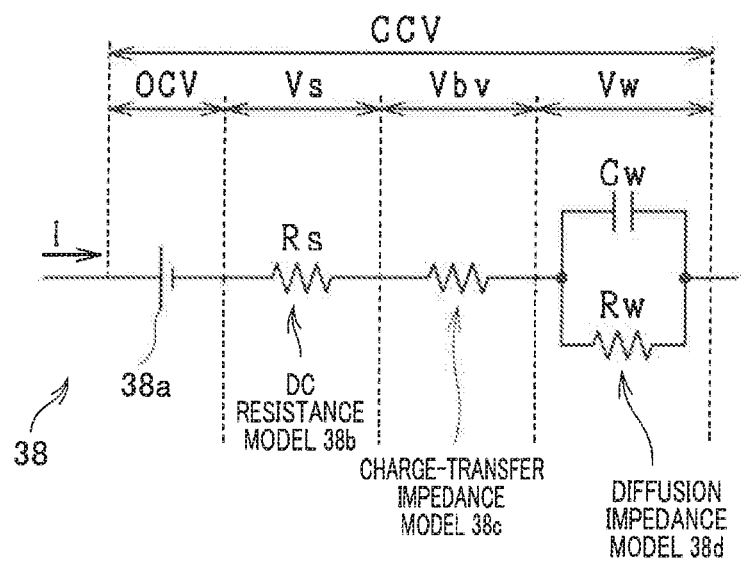
FIG. 3 is a diagram illustrating a battery model according to the first embodiment of the present invention.

Referring to FIG. 3, the battery model 38 according to the first embodiment basically includes a power source 38a, a DC resistance model 38b, a charge-transfer impedance model 38c, and a diffusion impedance model 38d. The power source 38a, the DC resistance model 38b, the charge-transfer impedance model 38c, and the diffusion impedance model 38d are connected in series to each other.

In FIG. 3, the DC resistance model 38b represents the DC resistance Rs of the battery cell 20a described above. The potential difference across the DC resistance Rs will be referred to as a DC-resistance voltage Vs hereinafter.

The current-transfer impedance model 38c represents a charge-transfer resistance Rr modelling the charge-transfer impedance of the battery cell 20a. The voltage difference across the charge-transfer resistance Rr will be referred to as a charge-transfer resistance voltage Vbr. Note that, in the first embodiment, the charge-transfer impedance model illustrated in FIG. 3 is conveniently represented by only the charge-transfer resistance Rr that is a DC resistance, and therefore the electric double layer capacitance is ignored. This is because the calculation period of one state of charge calculating routine of the calculator 32, i.e. the CPU 30a is set to be sufficiently longer than the time constant of the RC parallel circuit of the charge-transfer impedance.

The diffusion impedance model 45d represents the diffusion impedance of the battery cell 20a. Specifically, the diffusion impedance model 45d includes an RC parallel circuit comprised of a diffusion resistance having a resistance value Rw, and a diffusion capacitance having a capacitance value Cw. The potential difference across the RC parallel circuit 38d will be referred to as a polarization voltage Vw.

The following describes the DC resistance model 38b. The first embodiment represents the DC resistance voltage Vs in accordance with the following equation [eq1]:

$$Vs = Rs \cdot I \qquad [\text{eq 1}]$$

In the equation [eq1], reference character I represents a current flowing through the battery cell 20a. The DC resistance Rs depends on the temperature of the battery cell 20a. In the first embodiment, an Rs map, in which the DC resistance Rs and the cell temperature Ts are previously correlated with each other, is stored in the memory 31 as a part of the information VTI. The Rs map is designed such that, the higher the cell temperature Ts is, the lower the DC resistance Rs is. The current estimator 35 has a function of calculating the current resistance Rs in accordance with the cell temperature Ts and the Rs map.

Next, the following describes the charge-transfer impedance model 38c. In particular, the following describes a method of developing the charge-transfer resistance voltage Vbv in the charge-transfer impedance model 38c according to the first embodiment.

The Butler-Volmer equation for each battery cell 20a in the electrochemical field is given by the following equation [eq2]:

$$i = i_o \left\{ \exp\left(\frac{\alpha_s nF\eta}{RT}\right) - \exp\left(\frac{-(1-\alpha_s)nF\eta}{RT}\right) \right\} \qquad [\text{eq 2}]$$

Where
(1) i represents an electrode current density
(2) $i_o$ represents an exchange current density
(3) $\alpha_s$ represents an electrode-reaction transfer coefficient, i.e. an oxidation-reaction transfer coefficient
(4) n represents the number of electrons
(5) F represents the Faraday constant
(6) η represents overpotential
(7) R represents gas constant
(8) T represents the absolute temperature of the battery cell 20a.

For simplification, supposing that the positive electrode and the negative electrode are equivalent to each other, i.e. charge-discharge efficiency of the positive electrode is equivalent to that of the negative electrode, the following equation $a = \alpha_s = 1 - \alpha_s$ is satisfied, so that the following equation [eq3] is derived from the equation [eq2]:

$$i = i_o \left\{ \exp\left(\frac{anF\eta}{RT}\right) - \exp\left(\frac{-anF\eta}{RT}\right) \right\} \qquad [\text{eq 3}]$$

Transforming the equation [eq3] based on the relationship between hyperbolic sine function and exponential function derives the following equation [eq4]:

$$i = 2 \cdot i_o \cdot \sinh\left(\frac{anF\eta}{RT}\right) \qquad [\text{eq 4}]$$

Solving the equation [eq4] in view of the overpotential η derives the following equation [eq5]:

$$\eta = \frac{RT}{anF} \sinh^{-1}\left(\frac{1}{2 \cdot io} i\right) \qquad [\text{eq 5}]$$

Additionally, the relationship between the overpotential η and the charge-transfer resistance voltage Vbv using a proportional constant γ is expressed as the following equation [eq6]:

$$\eta = \gamma \cdot Vbv \quad [eq6]$$

The relationship between the current density i and the current I flowing through the battery cell 2a using the proportional constant, i.e. the adaptive coefficient, γ is also expressed as the following equation [eq7]:

$$i = \gamma \cdot I \quad [eq7]$$

Substituting the equations [eq6] and [eq7] into the equation [eq5] derives the following equation [eq8]:

$$\gamma \cdot Vbv = \frac{RT}{anF} \sinh^{-1}\left(\frac{1}{2 \cdot io} \gamma \cdot I\right) \quad [eq\ 8]$$

Arranging the equation [eq8] derives the following equation [eq9]:

$$Vbv = \frac{\alpha}{\gamma} T \cdot \sinh^{-1}(\beta \cdot \gamma \cdot I) \quad [eq\ 9]$$

Where $$\alpha = \frac{R}{anF}, \text{ and } \beta = \frac{1}{2 \cdot io}$$

In the equation [eq9], β represents a charge-transfer parameter associated with the charge-transfer resistance Rr, α represents a constant value, and γ represents the adaptive coefficient. The equation [eq9] shows that the charge-transfer parameter β enables the charge or discharge current I to correlate with the charge-transfer resistance voltage Vbv. Note that the first embodiment enables the measured current Is to be regarded as the current I flowing through the battery cell 2a.

Specifically, the equation [eq9] reveals that the charge-transfer resistance parameter β derived from the Butler-Volmer equation serves as a coefficient defining the relationship between an inverse hyperbolic sine function and the charge-transfer resistance voltage Vbv. In the equation [eq9], the inverse hyperbolic sine function has the current I, which flows through the battery cell 2a, as an independent variable, and the charge-transfer resistance voltage Vbv as a dependent variable.

As skilled persons in the art know well, the exchange current density io can be expressed in the following equation [eq10]:

$$io = i_\alpha \cdot C \cdot \exp\left(-\frac{K_t}{T}\right) \quad [eq\ 10]$$

Where $i_\alpha \cdot C$ and $K_t$ respectively represent predetermined constants.

Because the charge-transfer resistance parameter β is proportional to the reciprocal of the exchange current density io, the temperature characteristics of the charge-transfer resistance parameter β can be expressed as the following equation [eq11]:

$$\beta \propto \frac{1}{io} \propto \beta 0 \cdot \exp\left(\frac{K_t}{T}\right) \quad [eq\ 11]$$

Where β0 represents a predetermined constant.

That is, the charge-transfer resistance parameter β depends on the absolute temperature T.

Taking the natural logarithm of both sides of the equation [eq11] yields the following equation [eq12a]:

$$\ln(\beta) = \ln(\beta 0) + K_t \times \left(\frac{1}{T}\right) \quad [eq\ 12a]$$

This equation [eq12a] has the same form as the following equation [eq12b] as a linear function:

$$Y = AX + B \quad [eq12b]$$

Where A is K, and B is ln(β0).

Figure 6:
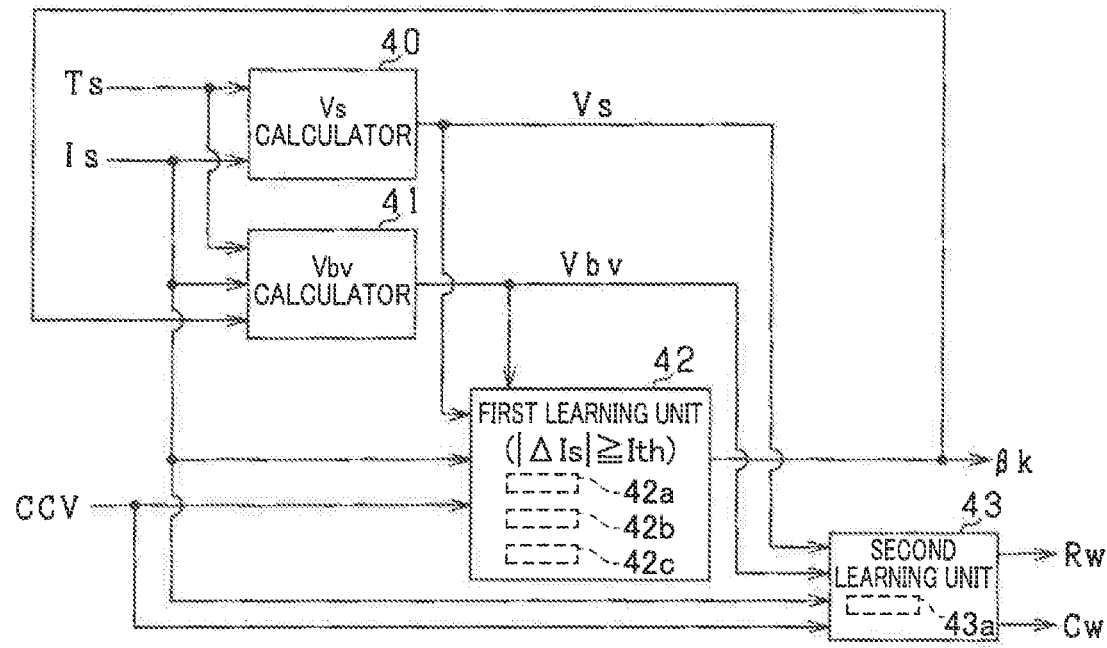
FIG. 6 is a block diagram illustrating a first learning routine and a second learning routine according to the first embodiment of the present invention.

On the basis of the relationships, measured values of the natural logarithm ln(β0) of the charge-transfer resistance parameter β versus corresponding values of the reciprocal of the absolute temperature T of the battery cell 20a are plotted in the graph having ln(β0) as its Y-intercept and 1/T as its X-intercept as illustrated in FIG. 6. The first embodiment obtains a linear function LF that is fit to the plotted measured values of the natural logarithm ln(β0) of the charge-transfer resistance parameter β with respect to the reciprocal of the absolute temperature T of the battery cell 20a (see FIG. 4). This enables a value of ln(β0) to be obtained as the y-intercept of the linear function LF, and a value of $K_t$ to be obtained as the gradient of the linear function LF.

Thus, the memory 31 stores the linear function LF of the charge-transfer resistance parameter β 1 with respect to the reciprocal of the absolute temperature T of the battery cell 20a, i.e. the set of the y-intercept ln(β0) and the gradient $K_t$, as β map information, which is part of the information VTI.

Specifically, the current estimator 35 refers to the β map information using the value of the absolute temperature T based on the cell temperature Ts measured by the temperature sensor 22. Then, the current estimator 35 extracts, from the β map information, a value of the natural logarithm ln(β0) of the charge-transfer resistance parameter β matching with the reciprocal of the value of the absolute temperature T. The current estimator 35 takes the exponential of the extracted value of the natural logarithm ln(β0) of the charge-transfer resistance parameter β, thus obtaining a value of the charge-transfer resistance parameter β.

Figure 5:
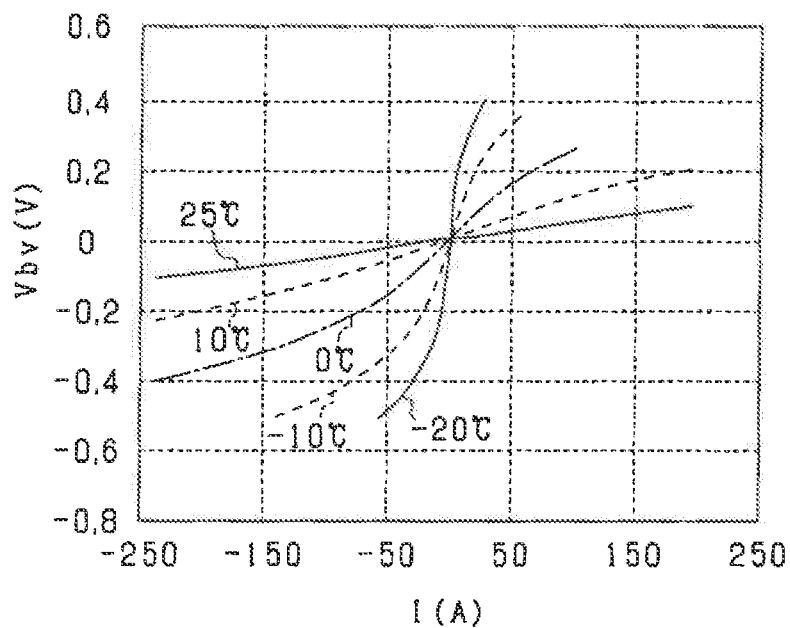
FIG. 5 is a graph illustrating the temperature dependence of the current-voltage characteristics depending on the charge-transfer resistance according to the first embodiment of the present invention.

FIG. 5 is a graph schematically illustrating (1) The relationship between the current I and the charge-transfer resistance voltage Vbv for the parameter of the cell temperature being 25° C.

(2) The relationship between the current I and the charge-transfer resistance voltage Vbv for the parameter of the cell temperature being 10° C.

(3) The relationship between the current I and the charge-transfer resistance voltage Vbv for the parameter of the cell temperature being 0° C.

(4) The relationship between the current I and the charge-transfer resistance voltage Vbv for the parameter of the cell temperature being −10° C.

(5) The relationship between the current I and the charge-transfer resistance voltage Vbv for the parameter of the cell temperature being −20° C.

FIG. 5 shows that the charge-transfer resistance voltage Vbv calculated in accordance with the equation [eq5] non-linearly changes with change of the current I particularly when the cell temperature Ts of the battery cell 20a lies within a low-temperature region, for example, a temperature region below 0 degrees.

That is, calculating the charge-transfer resistance voltage Vbv in accordance with the equation [eq5], in other words, the charge-transfer resistance parameter β enables the calculated charge-transfer resistance voltage Vbv to have nonlinear current-voltage characteristics matching with the nonlinear characteristics between the actual current I and the actual charge-transfer resistance voltage Vbv of the battery cell 20a with its cell temperature Ts lying within the low-temperature region, which is, for example, below 0 degrees.

Next, the following describes the diffusion impedance model 38d. The first embodiment expresses the polarization voltage Vw as the following equation [eq13]:

$$Vw(t) = -A \cdot Vw(t-1) + B \cdot Is(t) + B \cdot Is(t-1) \quad [eq13]$$

Where A is expressed as the following equation [eq13A], and B is expressed as the following equation [eq13B].

$$A = \frac{\Delta T - 2 \cdot Rw \cdot Cw}{\Delta T + 2 \cdot Rw \cdot Cw} \quad [eq\ 13A]$$

$$B = \frac{\Delta T \cdot Rw}{\Delta T + 2 \cdot Rw \cdot Cw} \quad [eq\ 13B]$$

Discretizing the transfer function of the RC parallel circuit 38d using bilinear transformation enables the equation [eq13] to be obtained. In the equations [eq13A] and [eq13B], $\Delta T$ represents the length of each calculation period of the calculator 32. The reference character (t) assigned to each of the polarization voltage Vw and the parameter B·Is represents that these polarization voltage Vw and the parameter B·Is in the equation [eq13] are values at the present calculation period of the calculator 32.

Similarly, the reference character (t−1) assigned to each of the parameter (−A·Vw) and the parameter B·Is represents that these parameters are values at the immediately previous calculation period of the calculator 32.

In the first embodiment, information, i.e. diffusion impedance information, about each of the resistance value Rw of the resistance component and the capacitance Cw of the capacitance component in the RC parallel circuit 38d is correlated with the absolute temperature T based on the cell temperature Ts measured by the temperature sensor 22, and stored in the memory 31 as part of the information VTI.

The reason why the information about each of the resistance value Rw of the resistance component and the capacitance Cw of the capacitance component in the RC parallel circuit 38d is correlated with the absolute temperature T based on the cell temperature Ts measured by the temperature sensor 22 is that each of the resistance value Rw of the resistance component and the capacitance Cw depends on the cell temperature T.

That is, the current estimator 35 has a function of calculating the resistance value Rw of the resistance component and the capacitance Cw of the capacitance component in the diffusion impedance in accordance with the diffusion impedance information stored in the memory 31 and the absolute temperature T based on the cell temperature Ts measured by the temperature sensor 22.

In FIG. 2, the output value of the voltage deviation calculator 34 represents the sum of the DC resistance voltage Vs, the charge-transfer resistance voltage Vbv, and the polarization voltage Vw. That is, the task carried out by the current estimator 35 is the task to calculate, as an estimation current Ie, a current that causes the sum (Vs+Vbv+Vw) to be generated.

Specifically, the current estimator 35 calculates the DC resistance Rs, the charge-transfer resistance parameter β, and the resistance value Rw of the resistance component and the capacitance Cw of the capacitance component in the RC parallel circuit 38d in accordance with the cell temperature T. Then, the current estimator 35 calculates, as the estimation current Ie, a current that enables the sum of the right-hand sides of the respective equations [eq1], [eq9], and [eq13] to match with the output value of the voltage deviation calculator 34. This calculation operation can use, as the value Is(t−1) in the right-hand side of the equation [eq13], the value of the estimation current Ie, which was calculated in the immediately previous calculation period.

The SOC calculator 36 calculates the SOC of the battery cell 20a based on the estimation current Ie calculated by the current estimator 35. The first embodiment calculates, as an example of a parameter indicative of the state of the battery cell 20a, the SOC [%] as a function of
1. An initial SOC0 as an initial value of the SOC
2. An integrated value of the estimation current Ie integrated from the initial SOC0
3. A rated capacity Ah0 of the battery cell 20a Specifically, the SOC calculator 36 calculates the SOC in accordance with the following equation [eq14]:

$$SOC = SOC0 + \frac{\sum Ie \cdot dt}{Ah0} \times 100 \quad [eq\ 14]$$

Note that the SOC calculator 36 can calculate the initial SOC0 in the following procedure. Specifically, the SOC calculator 36 obtains the terminal voltage across the battery cell 20a measured by the voltage sensor 21 as the open circuit voltage OCV on condition that charge or discharge into or from the battery pack 20 is stopped. Then, the SOC calculator 36 calculates the initial SOC0 in accordance with the OCV map using the open circuit voltage OCV as an input value to the OCV map.

2. First Learning Routine

The following describes the first learning routine of each calculator 32 for the corresponding battery cell 20a with reference to FIG. 6.

The first learning routine addresses a possibility of the charge-transfer resistance parameter β being deviated from a suitable value, i.e. an estimated value at its design time, due to, for example, deterioration of the battery cell 20a. Specifically, the first learning routine is to learn the charge-transfer resistance parameter β used by the current estimator 35. This enables reduction in the estimation accuracy of the SOC based on the operations illustrated in FIG. 2 to be avoided even if, for example, there is a deterioration in the battery cell 20a The following describes the first learning routine with reference to FIG. 6. Each calculator 32 includes a Vs calculator 40, a Vbv calculator 41, and a first learning unit 42 as a processing module for performing the first learning routine.

The Vs calculator 40 calculates the DC resistance voltage Vs expressed by the equation [eq1] in accordance with the DC resistance Rs calculated from the cell temperature Ts and a current, i.e. a measurement current Is.

The Vbv calculator 41 calculates the charge-transfer resistance voltage Vbv expressed by the equation [eq9] in accordance with the charge-transfer resistance parameter β calculated from the cell temperature Ts, the measurement current Is, and a correction coefficient $β_k$ calculated by the immediately previous calculation period.

The correction coefficient $\beta_k$ is a parameter learned by the first learning unit 42 for correcting the charge-transfer resistance parameter $\beta$ whose value is deviated from a suitable value due to, for example, deterioration of the battery cell 20a. That is, the correction coefficient $\beta_k$ can be expressed by the following equation [eq15]:

$$\ln(\beta) = \ln(\beta 0) + \ln(\beta_k) + K_t \times \left(\frac{1}{T}\right) \quad [\text{eq 15}]$$

Figure 4:
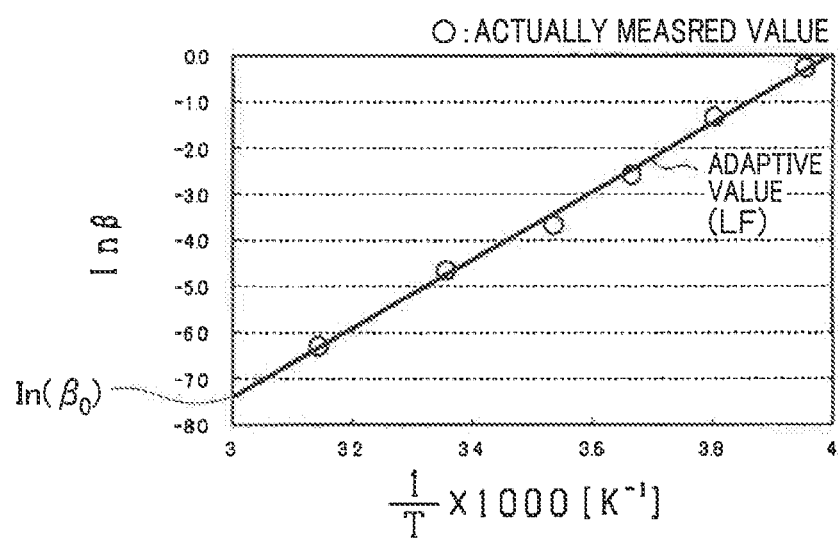
FIG. 4 is a graph illustrating a relationship between a charge-transfer resistance parameter and a battery temperature according to the first embodiment of the present invention.

Specifically, $\ln(\beta_k)$ represents the amount of change of the Y-intercept of the Arrhenius plot illustrated in FIG. 4

The first learning unit 42 learns the correction coefficient $\beta_k$ in accordance with the DC resistance voltage Vs calculated by the Vs calculator 40, the charge-transfer resistance voltage Vbv calculated by the Vbv calculator 41, the measurement current Is, and the terminal voltage CCV. In the first embodiment, the first learning unit 42 includes a first deviation calculator 42a, a second deviation calculator 42b, and a first parameter estimator 42c.

The following describes a learning method, i.e. a learning task, carried out by the first learning unit 42. Note that the first learning unit 42 can be implemented as a function of a first updating unit 32a or a function other than the first updating unit 32a.

The learning task transforms the equation [eq9] to the following equation [eq16] in view of the correction coefficient $\beta_k$:

$$I = \frac{1}{\gamma} \cdot \frac{1}{\beta_0 \times \beta_k} \sinh\left(\frac{\gamma}{\alpha} \cdot \frac{1}{T} Vbv\right) \quad [\text{eq 16}]$$

In equation [eq16], the charge-transfer resistance parameter $\beta$ is expressed by "$\beta = \beta_0 \times \beta_k$". The equation [eq16] represents a hyperbolic sine function including the reciprocal of the absolute temperature T of the battery cell 20a as an independent variable, the charge-transfer resistance voltage Vbv as an independent variable, and the current I flowing through the battery cell 20a as a dependent variable. In equation [eq16], the deviation of the measurement current Is(t) calculated at the present calculation period (t) from the measurement current Is(t−1) calculated at the immediately previous calculation period (t−1) is represented by the following equation [eq17]:

$$Is(t) - Is(t-1) = \left[\frac{1}{\gamma} \cdot \frac{1}{\beta_0} \sinh\left(\frac{\gamma}{\alpha} \cdot \frac{1}{T} Vbv(t)\right) - \frac{1}{\gamma} \cdot \frac{1}{\beta_0} \sinh\left(\frac{\gamma}{\alpha} \cdot \frac{1}{T} Vbv(t-1)\right)\right] \times \frac{1}{\beta_k} \quad [\text{eq 17}]$$

The left-hand side of the equation [eq17] represents a measurement-current deviation $\Delta Is(t)$ as the deviation of the measurement current Is(t) at the present calculation period from the measurement current Is(t−1) at the immediately previous calculation period; the measurement-current deviation $\Delta Is(t)$ corresponds to a first deviation. The right-hand side of the equation [eq17] represents an estimation-current deviation $\Delta F(t)$ corresponding to a second deviation. The charge-transfer resistance voltage Vbv at the present calculation period (t), which is expressed in the equation [eq17], is expressed by the following equation [eq18]:

$$Vbv(t) = CCV(t) - Vs(t) - Vw(t) - OCV(t)$$

Where CCV(t) represents the terminal voltage CCV at the present calculation period (t), Vs(t) represents the DC resistance voltage Vs at the present calculation period (t), Vw(t) represents the polarization voltage Vw at the present calculation period (t), and OCV(t) represents the open circuit voltage OCV at the present calculation period (t).

If the absolute value of the measurement-current deviation $\Delta Is$ is large during acceleration of the corresponding vehicle, it is possible to obtain the charge-transfer resistance voltage Vbv with a small influence from the polarization voltage Vw or the open circuit voltage OCV. This is because each of the DC resistance voltage Vs and the charge-transfer resistance voltage Vbv changes a value depending on the measurement current $\Delta Is$, but the amount of change of the polarization voltage Vw during one calculation period is a very small value due to its time constant, so that the amount of change of the polarization voltage Vw during one calculation period can be ignored.

Figure 7:
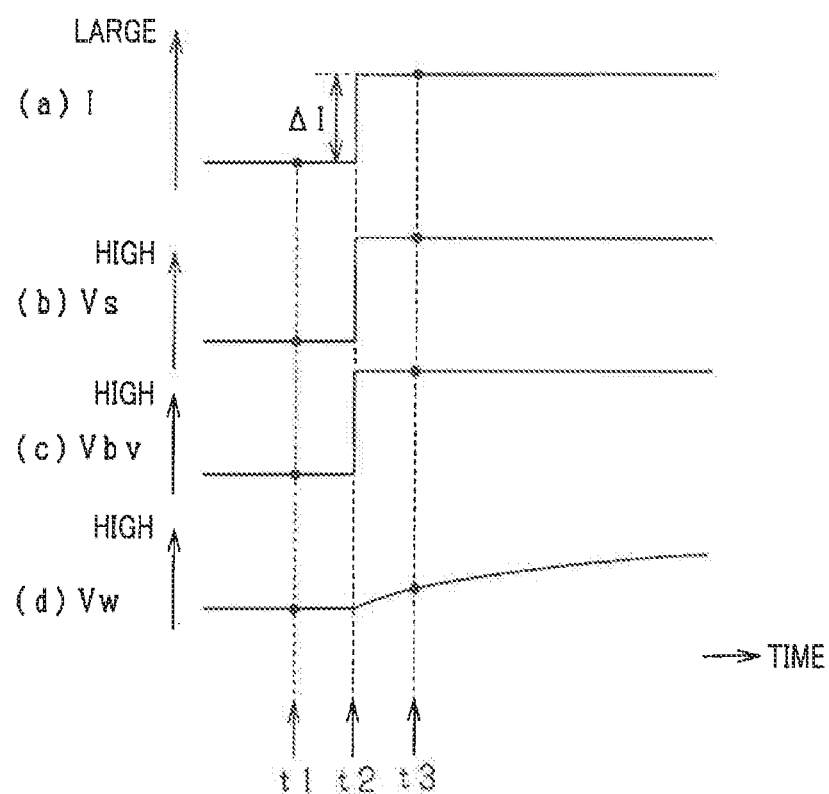
FIG. 7 is a timing chart schematically illustrating how a DC resistance voltage, a charge-transfer resistance voltage, and a polarization voltage are changed when the current is immediately changed according to the first embodiment of the present invention.

Specifically, referring to FIG. 7, if the absolute value of the measurement-current deviation $\Delta Is$ is large, each of the DC resistance voltage Vs and the charge-transfer resistance voltage Vbv changes immediately at time t2 at which the polarization voltage Vw starts to change due to the immediate change of the current I flowing through the battery cell 20a, although a certain amount of time is required until the polarization voltage Vw has converged.

Similarly, the amount of change of the open circuit voltage OCV during one calculation period is so small that the amount of change of the open circuit voltage OCV during one calculation period can be ignored. Note that FIG. 7 illustrates one calculation period as a time interval from time t1 to time t3.

Efficient correction of the correction coefficient $\beta_k$ in the equation [eq17] requires that the absolute value of the measurement-current deviation $\Delta Is$ is equal to or more than a predetermined value Ith that is more than zero on the assumption that the calculation period of the charge-transfer resistance voltages Vbv(t) and Vbv(t−1) in the right-hand side of the equation (eq17) is short.

Figure 8:
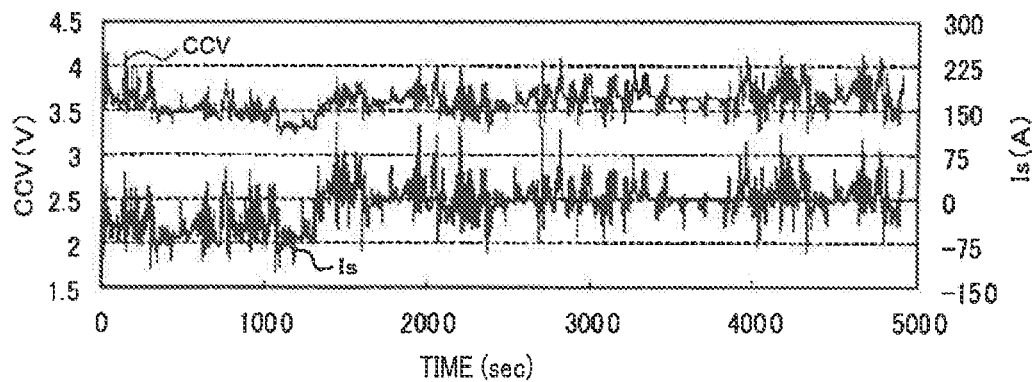
FIG. 8 is a timing chart schematically illustrating how the voltage across the battery cell and the current flowing through the battery cell illustrated in FIG. 1 are changed according to the first embodiment of the present invention.
Figure 9:
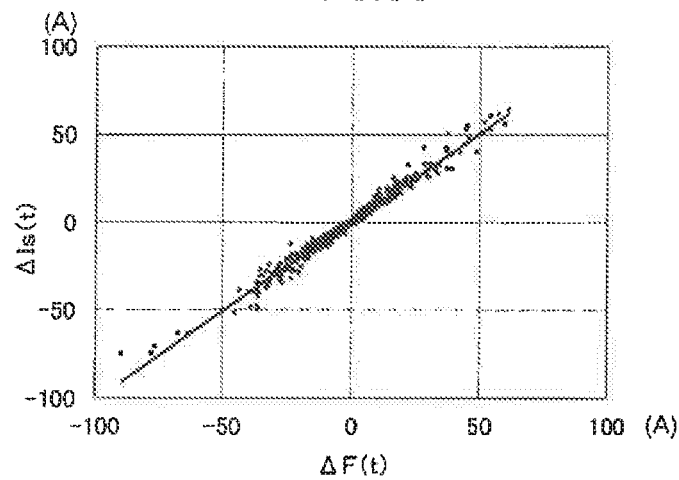
FIG. 9 is a graph schematically illustrating a relationship between an estimation-current deviation and a measurement-current deviation if the charge-transfer resistance parameter is suitable according to the first embodiment of the present invention.
Figure 10:
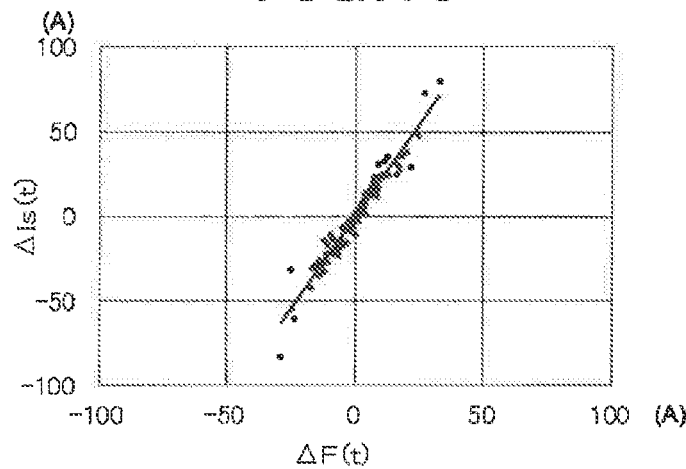
FIG. 10 is a graph schematically illustrating a relationship between an estimation-current deviation and a measurement-current deviation if the charge-transfer resistance parameter is unsuitable according to the first embodiment of the present invention.

FIG. 8 illustrates measured results of the measurement current Is and the terminal voltage CCV at a low temperature, such as −15° C., if the initial value of the charge-transfer resistance parameter $\beta$ is a suitable value with no deterioration of the battery cell 20a. In addition, FIG. 9 is a graph illustrating each of the estimation-current deviation $\Delta F$ and the measurement-current deviation $\Delta Is$ plotted based on the measured results. The estimation-current deviation $\Delta F$ represents a value obtained by calculating the right-hand side of the equation [eq17] based on the charge-transfer resistance voltage Vb calculated in accordance with the equation [eq18].

Referring to FIG. 9, if the initial value of the charge-transfer resistance parameter $\beta$ is a suitable value with no deterioration of the battery cell 20a, the linearity of the estimation-current deviation $\Delta F$ with respect to the measurement-current deviation $\Delta Is$ is ensured, and the plotted deviation $\Delta F$ and the plotted deviation $\Delta Is$ have a correlation having the gradient of 1, i.e. the correction coefficient $\beta_k$ is 1.

In contrast, if the battery cell 20a is in an advanced stage of deterioration and/or the initial value of the charge-transfer resistance parameter $\beta$ is deviated from a suitable value, although the linearity of the estimation-current deviation $\Delta F$ with respect to the measurement-current deviation $\Delta Is$ is ensured, the plotted deviation $\Delta F$ and the plotted deviation $\Delta Is$ have a correlation whose gradient is greatly deviated from the gradient of 1.

As described above, using the estimation-current deviation ΔF with respect to the measurement-current deviation ΔIs enables 1. The linearity of the estimation-current deviation ΔF with respect to the measurement-current deviation ΔIs to be ensured
2. How much the charge-transfer resistance parameter β defined in the β map is deviated from a value indicative of an actual charge-transfer resistance to be obtained From these viewpoints, the first learning unit 42 learns the correction coefficient $β_k$ to correspondingly match the estimation-current deviation ΔF with the measurement-current deviation ΔIs.

Figure 11:
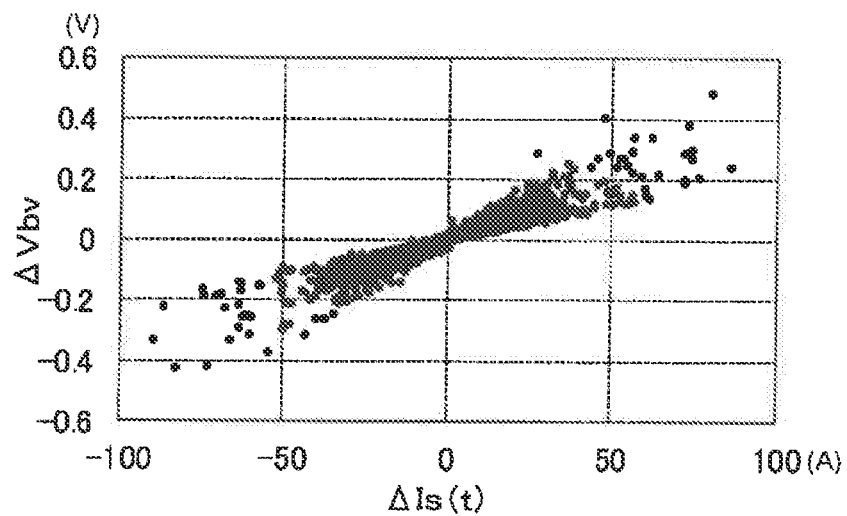
FIG. 11 is a graph schematically illustrating a relationship between the measurement-current deviation and the amount of change of the change-transfer resistance voltage according to the first embodiment of the present invention.
Figure 14:
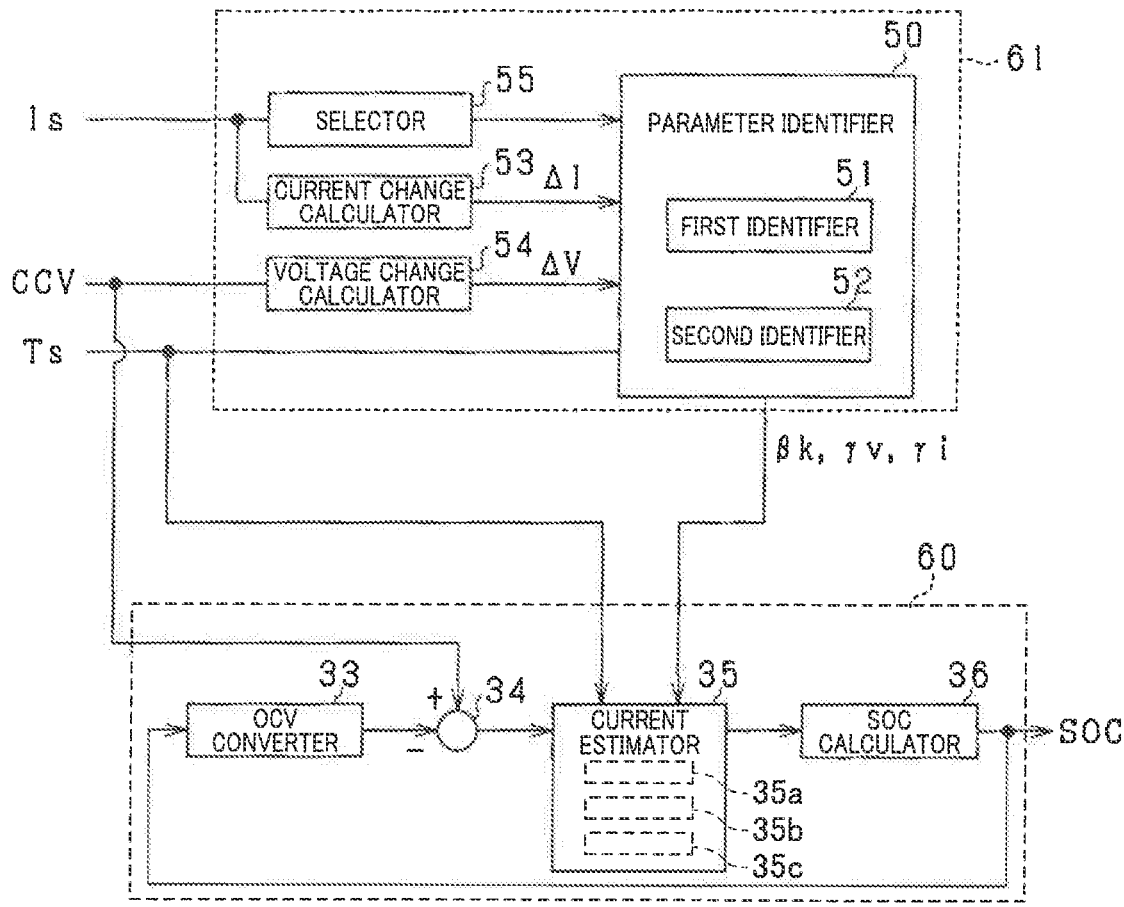
FIG. 14 is a block diagram illustrating an identifying routine of the charge-transfer resistance parameter $\beta$ and the adaptive coefficients $\gamma v$ and $\gamma i$ according to the second embodiment of the present invention.

Note that FIG. 11 is a graph illustrating the measurement-current deviation ΔIs plotted on the horizontal axis and the amount of change ΔVbv of the charge-transfer resistance voltage Vbv plotted on the vertical axis for one calculation period based on the equation [eq18] without using the equation [eq17]. As described above, the battery cell 20a has current-voltage characteristics that great nonlinearly change in a low-temperature region. For this reason, as illustrated in FIG. 14, the linearity of the amount of change ΔVbv of the charge-transfer resistance voltage Vbv with respect to the measurement-current deviation ΔIs is not ensured. The opportunity to perform the learning based on the amount of change ΔVbv of the charge-transfer resistance voltage and the measurement-current deviation ΔIs is very limited to a current region close to zero in which the linearity of the amount of change ΔVbv of the charge-transfer resistance voltage with respect to the measurement-current deviation ΔIs is ensured.

Each parameter included in the equation [eq17] are expressed by the following equations [eq19]:

$$y1(t) = Is(t) - Is(t-1) \qquad [eq\ 19]$$

$$\varphi1^T(t) = \left[\frac{1}{\gamma} \cdot \frac{1}{\beta_0} \sinh\left(\frac{\gamma}{\alpha} \cdot \frac{1}{T} Vbv(t)\right) - \frac{1}{\gamma} \cdot \frac{1}{\beta_0} \sinh\left(\frac{\gamma}{\alpha} \cdot \frac{1}{T} Vbv(t-1)\right)\right]$$

$$\theta1(t) = \frac{1}{\beta_k}$$

This enables the first learning unit 42 to calculate, based on the following equation [eq20] derived from the method of iterative least squares, a first parameter estimation θ1(t) for each calculation period:

$$\theta1(t) = \theta1(t-1) + \frac{P1(t-1)\varphi1(t)}{\lambda1 + \varphi1^T(t)P1(t-1)\varphi1(t)} \varepsilon1(t) \qquad (eq\ 20)$$

Where $$\varepsilon1(t) = y1(t) - \varphi1^T(t)\theta1(t-1)$$

$$P1(t) = \frac{1}{\lambda1}\left\{P1(t-1) - \frac{P1(t-1)\varphi1(t)\varphi1^T(t)P1(t-1)}{\lambda1 + \varphi1^T(t)P1(t-1)\varphi1(t)}\right\}$$

In the equation [eq20], P1 represents a covariance matrix, ε1 represents an estimated error, and λ1 represents a forgetting factor.

Specifically, the first learning unit 42 calculates the reciprocal of the correction coefficient $β_k$ as the first parameter estimation θ1(t). Then, the calculator 32 including the Vbv calculator 41 multiplies the correction coefficient $β_k$, i.e. the correction coefficient $β_k(t)$ calculated by the first parameter estimation θ1(t), to the charge-transfer resistance parameter β in the β map corresponding to the cell temperature Ts to correspondingly update the charge-transfer resistance parameter β. This results in the updated charge-transfer resistance parameter β being used by the Vbv calculator 41 and the current estimator 35.

Specifically, the calculator 32 according to the first embodiment includes the first updating unit 32a that performs an updating task of updating the charge-transfer resistance parameter β. In other words, the calculator 32 according to the first embodiment server as the first updating unit 32a to perform the updating task of updating the charge-transfer resistance parameter β.

Figure 12:
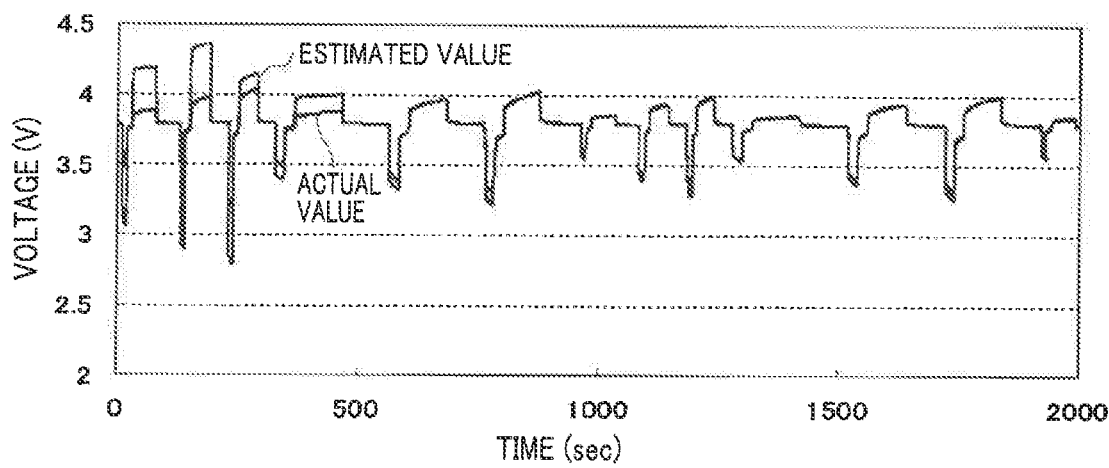
FIG. 12 is a timing chart illustrating an advantageous effect achieved by the first learning routine according to the first embodiment of the present invention.

The following describes an advantageous effect achieved by the first learning routine with reference to FIG. 12. FIG. 12 illustrates how each of an actual value and an estimated value of the terminal voltage across the battery cell 20a at a low temperature of, for example, −15° C. is changed over time. The estimated value corresponds to the sum of the open circuit voltage OCV calculated by the OCV calculator 33, the DC resistance voltage Vs calculated by the Vs calculator 40, the charge-transfer resistance voltage Vbv calculated by the Vbv calculator 41, and the polarization voltage Vw calculated in accordance with the equation [eq13].

The example illustrated in FIG. 12 shows that the initial value of the charge-transfer resistance parameter β is deviated from a suitable value representing the charge-transfer impedance model. This results in the estimated value of the terminal voltage CCV being greatly deviated from the actual value of the terminal voltage CCV for a limited time. However, thereafter, the first learning routine successively updates the charge-transfer resistance parameter β, thus enabling the estimated value of the terminal voltage CCV to match with the actual value of the terminal voltage CCV.

3. Second Learning Routine

The following describes the second learning routine of each calculator 32 for the corresponding battery cell 20a with reference to FIG. 6.

The second learning routine is to learn the resistance value Rw of the resistance component and the capacitance Cw of the capacitance component in the RC parallel circuit 38d.

Each calculator 32 includes a second learning unit 43 as a processing module for performing the second learning routine in addition to the Vs calculator 40 and the Vbv calculator 41.

The second learning unit 43 learns the resistance value Rw of the resistance component and the capacitance Cw in accordance with the DC resistance voltage Vs, the charge-transfer resistance voltage Vbv, the measurement current Is, and the terminal voltage CCV. In the first embodiment, the second learning unit 43 includes a second parameter estimator 43a.

The following describes a learning method, i.e. a learning task, carried out by the second learning unit 43.

Figure 13:
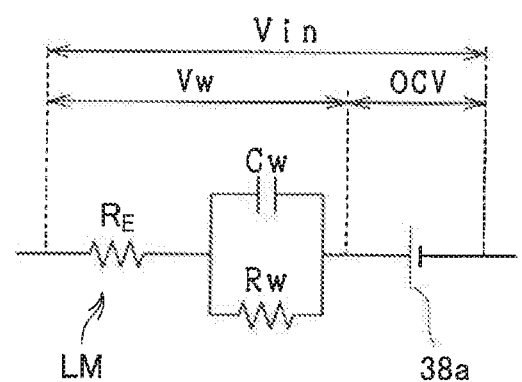
FIG. 13 is a diagram illustrating a battery model used by a second learning routine according to the first embodiment of the present invention.

FIG. 13 illustrates a circuit model LM used by the second learning unit 43 for learning the resistance value Rw of the resistance component and the capacitance Cw of the capacitance component according to the second embodiment. The circuit model LM additionally includes an error resistance connected in series to the parallel circuit of the resistance value Rw of the resistance component and the capacitance Cw of the capacitance component. In FIG. 3, the error resistance is expressed by $R_E$. The error resistance is provided based on the probability that each of the charge-transfer resistance voltage Vbv and the DC resistance voltage Vs includes an error.

An applied voltage Vin to the circuit model LM illustrated in FIG. 13 is expressed by the following equation [eq21]:

$$Vin(t) = CCV(t) - OCV(t) - Vs(t) - Vbv(t) \quad [eq21]$$

The amount of change of the applied voltage Vin, which will be referred to as the amount of voltage change ΔVin, for one calculation period is expressed by the following equation [eq22]:

$$\Delta Vin(t) = Vin(t) - Vin(t-1) \quad [eq22]$$

In addition, the amount of voltage change ΔVin can also be expressed by the following equation [eq23]:

$$\Delta Vin(t) = -a1 \cdot \Delta Vin(t-1) + b0 \cdot \Delta Is(t) + b1 \cdot \Delta Is(t-1) \quad [eq\ 23]$$
$$= [\Delta Vin(t-1) \quad \Delta Is(t) \quad \Delta Is(t-1)] \begin{bmatrix} -a1 \\ b0 \\ b1 \end{bmatrix}$$

Where $$a1 = \frac{\Delta T - 2 \cdot Rw \cdot Cw}{\Delta T + 2 \cdot Rw \cdot Cw}$$

$$b0 = \frac{\Delta T(R_E + Rw) + 2R_E \cdot Rw \cdot Cw}{\Delta T + 2 \cdot Rw \cdot Cw}$$

$$b1 = \frac{\Delta T(R_E + Rw) - 2R_E \cdot Rw \cdot Cw}{T + 2 \cdot Rw \cdot Cw}$$

Using the method disclosed in Japanese Patent Application Publication No. 2011-122951 enables the above equation [eq23] to be derived. Specifically, expressing an impedance across terminals of the circuit model illustrated in FIG. 13 using Laplace operator s, and discretizing and transforming the impedance across the terminals enable the above equation [eq13] to be obtained.

The parameters included in the equation [eq23] are expressed by the following equations [eq2⁴]:

$$y2(t) = \Delta Vin(t) - \Delta Vin(t-1) \quad [eq\ 24]$$

$$\varphi 2^T(t) = [\Delta Vin(t-1) \quad \Delta Is(t) \quad \Delta Is(t-1)]$$

$$\theta 2(t) = \begin{bmatrix} -a1 \\ b0 \\ b1 \end{bmatrix}$$

This enables the second learning unit 43 to calculate, based on the following equation [eq25] derived from the method of iterative least squares, a second parameter estimation θ2(t):

$$\theta 2(t) = \theta 2(t-1) + \frac{P2(t-1)\varphi 2(t)}{\lambda 2 + \varphi 2^T(t)P2(t-1)\varphi 2(t)} \varepsilon 2(t) \quad [eq\ 25]$$

Where $$\varepsilon 2(t) = y2(t) - \varphi 2^T(t)\theta 2(t-1)$$

$$P2(t) = \frac{1}{\lambda} \left\{ P2(t-1) - \frac{P2(t-1)\varphi 2(t)\varphi 2^T(t)P2(t-1)}{\lambda 2 + \varphi 2^T(t)P2(t-1)\varphi 2(t)} \right\}$$

In the equation [eq25], P2 represents a covariance matrix, ε2 represents an estimated error, and Δ2 represents a forgetting factor.

Specifically, the second learning unit 43 calculates the resistance value Rw of the resistance component, the capacitance Cw of the capacitance component, and a value of the error resistance $R_E$ in accordance with the calculated second parameter estimation θ2(t) and the following equations [eq26]:

$$Rw = \frac{2(b1 - a1 \cdot b0)}{1 - a1^2} \quad [eq\ 26]$$

$$Cw = \frac{\Delta T(1 - a1)^2}{4(b1 - a1 \cdot b0)}$$

$$R_E = \frac{b0 - b1}{1 - a1}$$

The value of the error resistance R for absorbing an error of the charge-transfer resistance voltage Vbv and an error of the DC resistance voltage Vs becomes close to zero or may become a negative value.

Specifically, the calculator 32 updates, based on the calculated (learned) resistance value Rw and the capacitance Cw by the second learning unit 43, the diffusion impedance information; the diffusion impedance information is associated with the resistance value Rw of the resistance component, the capacitance Cw of the capacitance component, stored in the memory 31, and correlated with the cell temperature Ts, i.e. the absolute temperature T. The current estimator 35 therefore uses the updated diffusion impedance information.

Specifically, the calculator 32 according to the first embodiment serves as the second updating unit 32b to perform the updating task of updating the diffusion impedance information.

Note that the second learning unit 43 can be configured to pass each of all the parameters Vs, Vbv, Is, and CCV, which are input thereto, through a low-pass filter having a time constant matching with the time constant of the RC parallel circuit that should be learned. This enables the learned resistance value Rw and the capacitance Cw to become more stable values.

Note that, for example, the SOC calculator 36 of the calculator 32 can subtract, from the terminal voltage OCV of the battery cell 20a measured by the voltage sensor 21, the sum of 1. The DC resistance voltage Vs,
2. The charge-transfer resistance voltage Vbv,
3. The polarization voltage Vw
4. The product of the value of the error resistance $R_E$ and the measurement current Is Then, the SOC calculator 36 can calculate the open circuit voltage OCV as the result of the subtraction. The SOC calculator 36 can calculate the SOC of the battery cell 20a in accordance with the calculated open circuit voltage OCV and the OCV map.

The above first embodiment achieves the following advantageous effects.

The battery ECU 30 includes, as the charge-transfer impedance model, a model including the change-transfer resistance parameter β that (1) Corresponds to the exchange current density of the Butler-Volmer equation
(2) Correlates with the cell temperature Ts, i.e. the absolute temperature T.

This enables the nonlinear current-voltage characteristics of each battery cell 20a at low temperatures with higher accuracy.

In addition, the battery ECU 30 performs the first learning routine based on the method of iterative least squares to correspondingly update iteratively the change-transfer resistance parameter β. This avoids deterioration of the estimation accuracy of the SOC of each battery cell 20a even if there is a deterioration in the corresponding battery cell 20a and/or the initial value of the change-transfer resistance parameter β is deviated from a suitable value.

The battery ECU 30 performs the first learning routine upon the absolute value of the measurement current Is being equal to or higher than the predetermined value Ith. This enables 1. Whether the behavior of the voltage variations across the battery cell 20a mainly depends on the nonlinear charge-transfer resistance to be determined 2. The correction coefficient $\beta_k$ for correcting the change-transfer resistance parameter β to be calculated when it is determined that the behavior of the voltage variations across the battery cell 20a mainly depends on the nonlinear charge-transfer resistance This avoids erroneous learning of the correction coefficient $\beta_k$ due to influence from the polarization voltage Vw.

The battery ECU 30 performs the second learning routine based on the error resistance connected in series to the equivalent RC parallel model 38d to thereby iteratively update the resistance value Rw of the resistance component and the capacitance Cw of the capacitance component in the RC parallel equivalent circuit 38d. This enables calculation of the polarization voltage Vw to have more restricted influence from the errors included in the respective DC resistance voltage Vs and the charge-transfer resistance voltage Vbv. In contrast, if no error resistance was used, the estimated resistance value Rw of the resistance component might include influence from the errors. This might reduce the estimation accuracy of the resistance value Rw.

Second Embodiment

The following describes the second embodiment with a focus on the different points of the second embodiment from the first embodiment with reference to the corresponding drawings.

Each calculator 32 according to the second embodiment sequentially identifies and updates adaptive coefficients γ in addition to the charge-transfer resistance parameter β in the above equation [eq9] used for estimating the state of the corresponding battery cell 20a using an adaptive digital filter. This is based on the probability that each adaptive coefficient γ is deviated from a suitable value, such as a value adapted at its design time due to, for example, deterioration of the corresponding battery cell 20a.

The following describes a task to identify the charge-transfer resistance parameter β and the adaptive coefficients γ with reference to FIG. 14. FIG. 14 illustrates a processor 61, which is provided in each calculator 32, for identifying the charge-transfer resistance parameter β and the adaptive coefficients γ. The processor 61 corresponds to the first learning unit 42 described in the first embodiment.

Specifically, the charge-transfer resistance parameter β and the adaptive coefficients γ identified by the processor 61 are used by the current estimator 35, which constitutes the state estimator 60, for calculating the estimation current Is. In particular, the current estimator 35 updates the parameters β and γ that have been included in the right-hand side of the equation [eq9] used for estimating the estimation current Is using the input parameters β and γ.

Referring to FIG. 14, the processor 61 includes a parameter identifier 50. The parameter identifier 50 includes a first identifier 51 for identifying the charge-transfer resistance parameter β, and a second identifier 52 for identifying the adaptive coefficients γ.

First, the following describes a method of identifying the charge-transfer resistance parameter β according to the second embodiment.

An initial value of the charge-transfer resistance parameter β, which will be referred to as an initial parameter βmap, is expressed by the following equation [eq27]:

$$\beta_{map} = \beta_0 \cdot \exp\left(\frac{K_t}{T}\right)$$

Figure 15:
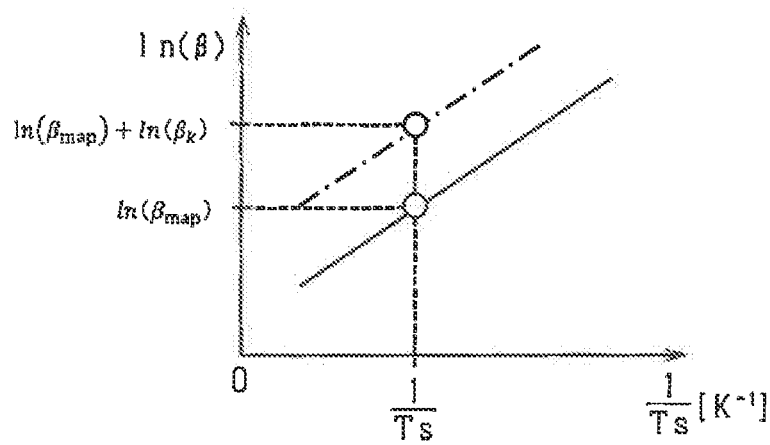
FIG. 15 is a graph illustrating a relationship between an initial parameter $\beta$map and a correction coefficient $\beta_k$ according to the second embodiment of the present invention.

In the second embodiment, as illustrated by the solid line in FIG. 15 and the following equation [eq28], the initial parameter βmap is mathematized such that the natural logarithm of the initial parameter βmap is a linear expression of the reciprocal of the cell temperature Ts, and the mathematized initial parameter βmap is stored in the memory 31 as part of the information VTI. For this reason, obtaining the cell temperature Ts enables the initial parameter βmap to be identified. This enables the initial value of the charge-transfer resistance parameter β, i.e. the initial parameter βmap, to be accurately determined.

$$\ln(\beta_{map}) = \frac{K_t}{T_s} + \ln(\beta 0) \qquad [\text{eq 28}]$$

In the second embodiment, the charge-transfer resistance parameter β is defined by the following equation [eq29]:

$$\beta = \beta_k \times \beta_{map} = \beta_k \times \beta_0 \times \exp\left(\frac{K_t}{T}\right) \qquad [\text{eq 29}]$$

Where $\beta_k$ represents a correction coefficient to be identified by the first identifier 51, and an initial value of the correction coefficient $\beta_k$ is set to 1 according to the second embodiment. Taking the logarithm of both sides of the equation [eq29] derives the following equation [eq30]:

$$\ln(\beta) = \frac{K_t}{T_s} + \ln(\beta 0) + \ln(\beta_k) \qquad [\text{eq 30}]$$

When the correction coefficient $\beta_k$ becomes 1, the value $\ln(\beta_k)$ in the equation [eq30] becomes zero, that is, the solid line and a dot-and-dash line are aligned with each other.

Each calculator 32 according to the second embodiment calculates, based on the mathematical formula whose shape has the equation [eq28] stored in the memory 31, a natural logarithm value of the initial parameter $\beta_{map}$ corresponding to the cell temperature Ts which is used as an input value thereto. This calculation function is, for example, installed in the current estimator 35 illustrated in FIG. 14. Specifically, the current estimator 35 serves as a calculator. The current estimator 35 transforms the calculated natural logarithm value ln (βmap) into an exponential function to correspondingly obtain the initial parameter βmap. Then, the current estimator 35 multiplies the correction coefficient $\beta_k$ to the initial parameter $\beta$map, thus calculating the charge-transfer resistance parameter $\beta$.

As illustrated in the equation [eq28], the charge-transfer resistance parameter $\beta$ is a parameter that exponentially changes with respect to the temperature of the battery cell 20a. Specifically, the charge-transfer resistance parameter $\beta$ may change in orders of magnitude within a predetermined usable temperature range of the battery cell 20a as illustrated in FIG. 4. For this reason, for use of the adaptive digital filter, it is desired not to use the charge-transfer resistance parameter $\beta$ as a target to be identified, but to use the correction coefficient $\beta_k$, which is a value obtained by normalizing the charge-transfer resistance parameter $\beta$, as a target to be identified. This aims to avoid deterioration of the accuracy of identifying the charge-transfer resistance parameter $\beta$ due to a minimum unit of processing, i.e. a least significant bit (LSB), by each calculator 32.

In detail, let us consider a structure that uses the charge-transfer resistance parameter $\beta$ as a target to be identified. In this structure, the charge-transfer resistance parameter $\beta$ may greatly change depending on the use temperature of the battery cell 20a. For this reason, change in the temperature of the battery cell 20a during the corresponding vehicle travelling may result in reduction of the accuracy of identifying the charge-transfer resistance parameter $\beta$. In addition, change in time required for calculating the charge-transfer resistance parameter $\beta$ may result in reduction of the accuracy of identifying the charge-transfer resistance parameter $\beta$.

In contrast, because the correction coefficient $\beta_k$ is normalized, it is possible to calculate a stable value of the correction coefficient $\beta_k$. Using the normalized correction coefficient $\beta_k$ enables concerns, such as cancelation of digits, to be avoided, thus avoiding reduction in the accuracy of identifying the charge-transfer resistance parameter $\beta$.

In addition, the second embodiment is configured such that the initial parameter $\beta$map expressed by the equation [eq28] is stored in the memory 31. This enables the variation range of the value $\ln(\beta_{map})$ within the usable temperature range of the battery cell 20a to be reduced, making it possible to improve the accuracy of the initial parameter $\beta$map.

As illustrated by a dot-and-dash line in FIG. 15, values of the initial parameter $\beta$map may be deviated from the adapted values of the initial parameter $\beta$map at its design time stored in the memory 31. The correction coefficient $\beta_k$ enables this deviation to be corrected. Specifically, as illustrated in FIG. 15, because the Y-intercept of the Arrhenius plot changes due to, for example, deterioration of the battery cell 20a, the second embodiment is configured to correct this change using the correction coefficient $\beta_k$. Note that, in the equation [eq28], $K_f$ represents a constant value defined from a physical constant. For this reason, the gradient of each of the solid line and the dot-and-dash line illustrated in FIG. 15 remains unchanged before and after deterioration of the battery cell 20a.

The second embodiment is configured not to derive, from the equation [eq9] itself, the equation [eq16] as described in the first embodiment, but to apply Maclaurin expansion to the equation [eq9]. Specifically, applying Maclaurin expansion to the right-hand side of the equation [eq9] with respect to the current I flowing through the battery cell 20a up to a primary expression of the current I enables the following equation [eq31] to be derived:

$$Vbv=(\alpha \cdot T \cdot \beta) \times 1 \qquad [eq31]$$

Substituting the equation [eq29] into the equation [eq31] enables the following equation [eq32] to be derived:

$$Vbv=(\alpha \cdot T \cdot \beta_{map} \cdot \beta_k) \times I \qquad [eq32]$$

Figure 16:
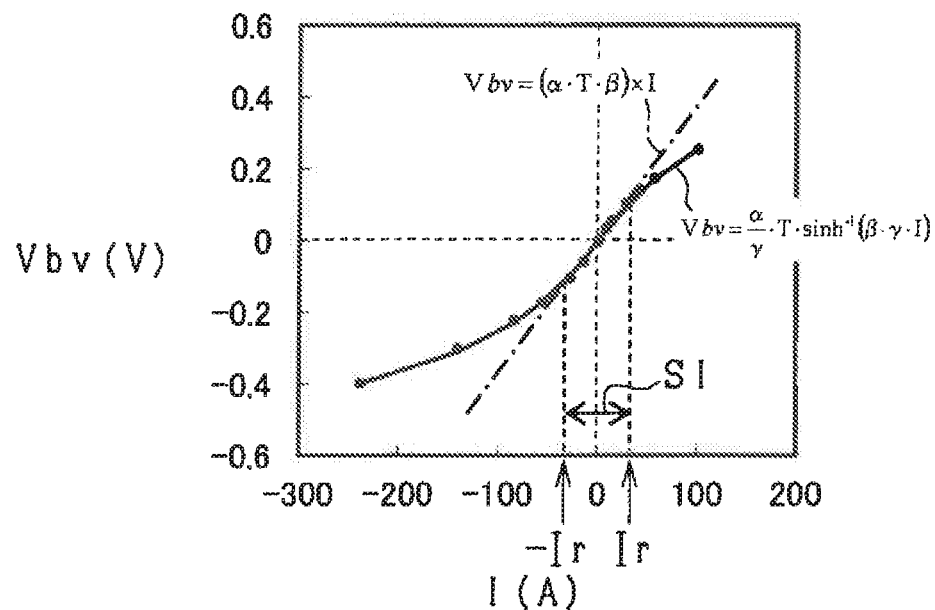
FIG. 16 is a graph illustrating the Butler-Volmer equation and an approximate expression in the vicinity of 0 A according to the second embodiment of the present invention.

Referring to FIG. 16, the equation [eq32] is an approximate expression of the equation [eq9] at 0 A or thereabout of the current I flowing through the battery cell 20a, and the equation [eq32] represents that the charge-transfer resistance voltage Vbv is defined as a linear equation of the current I. In the equation [eq32], the term $(\alpha \cdot T \cdot \beta_{map} \cdot \beta_k)$ has dimensions of electrical resistance, reference character $\alpha$ represents a physical constant, and the absolute temperature T of the battery cell 20a is a known value. For this reason, the charge-transfer resistance parameter $\beta$ enables the gradient at 0 A or thereabout of the current I to be adapted.

On the other hand, the difference between the terminal voltage CCV(t) measured by the voltage sensor 21 at the present calculation period and the terminal voltage CCV(t−1) measured by the voltage sensor 21 at the immediately previous calculation period is defined as a measurement voltage deviation $\Delta V(t)$. Referring to the equation [eq18] enables the measurement voltage deviation $\Delta V(t)$ to be expressed by the following equation:

$$\Delta V(t) = \{OCV(t) - OCV(t-1)\} + \{Vs(t) - Vs(t-1)\} + \qquad [eq\ 33]$$
$$\{Vbv(t) - Vbv(t-1)\} + \{Vw(t) - Vw(t-1)\} =$$
$$\Delta OCV(t) + \Delta Vs(t) + \Delta Vbv(t) + \Delta Vw(t)$$

For removing offset errors included in the measured values by the respective current sensor 23 and voltage sensor 21, and influence from an error included in the open circuit voltage OCV, each calculator 32 successively identifies, for the interval from the time (t−1) of the immediately previous calculation period to the time (t) of the present calculation period, a value of the correction coefficient $\beta_k$ in accordance with the measurement voltage deviation $\Delta V(t)$ and the measurement current deviation $\Delta I(t)$ when the measurement current Is changes greatly.

Figure 17:
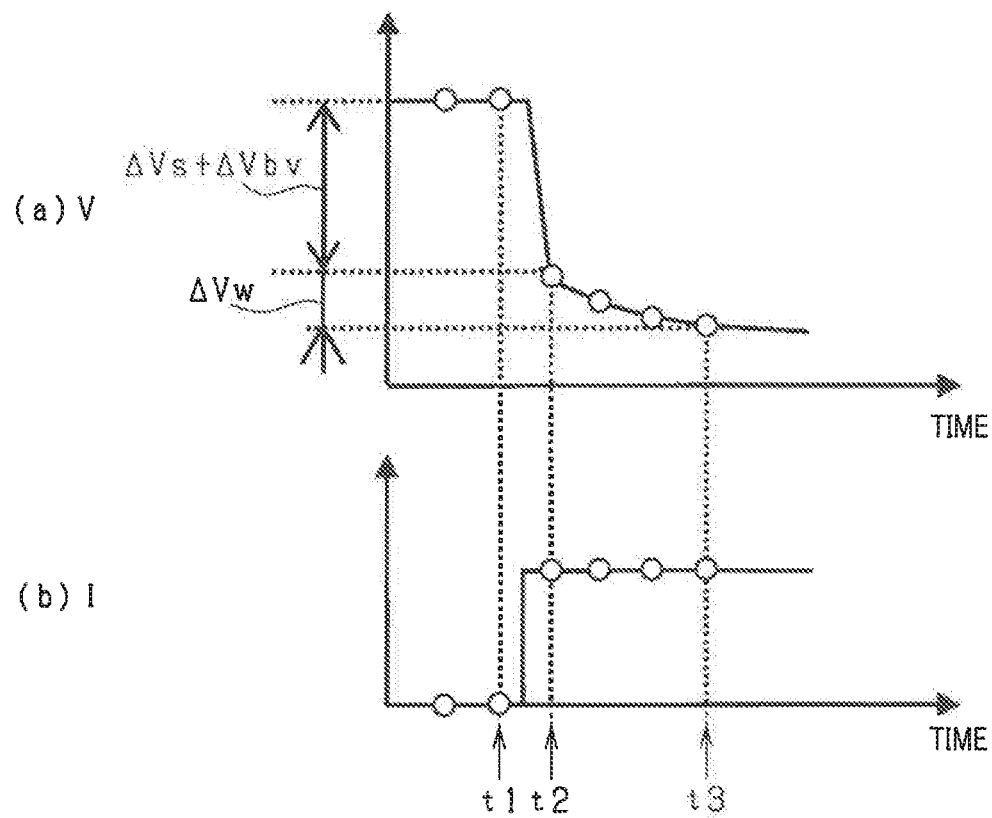
FIG. 17 is a timing chart illustrating how the terminal voltage across the secondary battery is changed when the current flowing through the battery cell is rapidly changed according to the second embodiment of the present invention.

Reference character (a) of FIG. 17 represents how the terminal voltage across the battery cell 20a is changed, and reference character (b) of FIG. 17 represents how the current I flowing through the battery cell 20a is changed. As illustrated in FIG. 17, after the battery cell 20a is in an unloaded condition at time t1, a constant load is putted on the battery cell 20a. In this case, as described above, a voltage drop $\Delta Vw$ having a long time constant is sufficiently smaller than a voltage drop "$\Delta Vs+\Delta Vbv$" with no time constant. In addition, the amount of change $\Delta OCV(t)$ is also sufficiently smaller than the voltage drop "$\Delta Vs+\Delta Vbv$". For this reason, it is possible to ignore each of the amount of change $\Delta OCV(t)$ and $\Delta Vw(t)$ during sufficiently short one calculation period. This therefore enables the equation [eq30] to be expressed by the following equation [eq34]:

$$\Delta V(t)=\Delta Vs(t)+\Delta Vbv(t) \qquad [eq34]$$

This enables each calculator 32 to extract, from the measurement voltage deviation $\Delta V$, the DC resistance voltage Vs and the charge-transfer resistance voltage Vbv. In addition, ignoring each of the amount of change $\Delta OCV(t)$ and $\Delta Vw(t)$ enables calculation load of each calculator 32 to be eliminated.

The equations [eq34] and [eq32] enable the following equations [eq35a] and [eq35b] to be derived:

$$\Delta Vbv(t)=\Delta V(t)-Rs \cdot \Delta I(t) \qquad [eq35a]$$

$$\rightarrow \Delta V(t) - Rs \cdot \Delta I(t) = (\alpha \cdot T \cdot \beta_{map} \cdot \beta_k) \times \Delta I(t) \quad [\text{eq35b}]$$

In the equation [eq35b], the parameters are expressed by the following respective equations [eq36]:

$$y_a(t) = \Delta V(t) - R_s \cdot \Delta I(t)$$

$$\varphi_a^T(t) = (\alpha \cdot T \cdot \beta_{map} \cdot \beta_k) \times \Delta I(t)$$

$$\theta_a(t) = \beta_k \quad [\text{eq36}]$$

Where $y_a$ represents an observed value. A model estimation value $y_{aest}$ and an estimation error $\varepsilon_a$ are expressed by the following equation [eq37]:

$$y_{aest}(t) = \varphi_a^T(t)\theta_a(t-1)$$

$$\varepsilon_a(t) = y_a(t) - y_{aest}(t) \quad [\text{eq37}]$$

Each calculator 32 successively identifies a value of the parameter estimation $\theta_a$ in accordance with the method of least squares based on the following equation [eq38] to correspondingly minimize the estimation error $\varepsilon_a$:

$$\theta_a(t) = \theta_a(t-1) + G_a(t)\varepsilon_a(t) \quad [\text{eq 38}]$$

Where $$G_a(t) = \frac{P_a(t-1)\varphi_a(t)}{\lambda_a + \varphi_a^T(t)P_a(t-1)\varphi_a(t)}$$

$$P_a(t) = \frac{1}{\lambda_a}\left\{P_a(t-1) - \frac{P_a(t-1)\varphi_a(t)\varphi_a^T(t)P_a(t-1)}{\lambda_a + \varphi_a^T(t)P_a(t-1)\varphi_a(t)}\right\}$$

In the equation [eq38], $G\alpha$ represents an adaptive gain, $P_a$ represents a covariance matrix, and $\lambda_a$ represents a forgetting factor.

Specifically, the parameter identifier 50 is configured to

1. Sequentially identify the parameter estimation $\theta_a$ in accordance with the method of least squares based on the equations [eq37] and [eq38] using, as input values, the observed value $y_a(t)$ defined based on the measurement voltage deviation $\Delta V(t)$, the measurement current deviation $\Delta I(t)$, and the DC resistance Rs 2. Calculate the correction coefficient $\beta_k$ based on the identified parameter estimation $\theta_a$.

Specifically returning to FIG. 14, the first identifier 51 calculates the observed value $y_a(t)$ based on the measurement voltage deviation $\Delta V(t)$, the measurement current deviation $\Delta I(t)$, and the DC resistance Rs calculated from the cell temperature Ts. The first identifier 51 sequentially identifies the parameter estimation $\theta a$ in accordance with the method of least squares based on the equations [eq37] and [eq38] using, as an input value, the observed value $y_a(t)$ defined based on the measurement voltage deviation $\Delta V(t)$, the measurement current deviation $\Delta I(t)$, and the DC resistance Rs. Then, the first identifier 51 calculates the correction coefficient $\beta_k$ based on the identified parameter estimation $\theta_a$.

The processor 61 includes a current change calculator 53, a voltage change calculator 54, and a selector 55 in addition to the parameter identifier 50. The current change calculator 53 calculates the measurement current deviation $\Delta I(t)$, and the voltage change calculator 54 calculates the measurement voltage deviation $\Delta V(t)$. The DC resistance Rs can be calculated based on the Rs map set forth above.

Next, the following describes a method of identifying the adaptive coefficients $\gamma$ according to the second embodiment.

Figure 18:
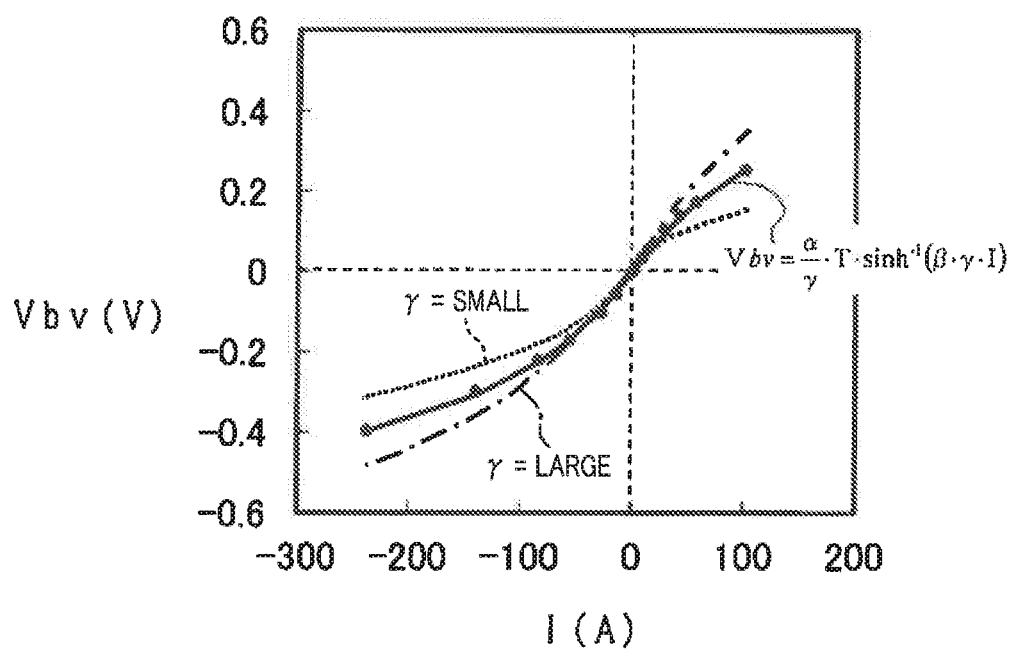
FIG. 18 is a graph illustrating a relationship between the Butler-Volmer equation and the adaptive coefficients according to the second embodiment of the present invention.

The adaptive coefficients $\gamma$ are proportional coefficients defining the function between the charge-transfer resistance voltage Vbv and the current I flowing through the battery cell 20a. Variably setting the adaptive coefficients $\gamma$ enables the charge-transfer resistance voltage Vbv in a large region of the current I without changing the gradient of the function at the current I being zero or thereabout (see FIG. 18). Note that it is possible to set an adaptive coefficient $\gamma c$ when the battery cell 20a is charged, and an adaptive coefficient $\gamma d$ when the battery cell 20a is discharged. For example, the adaptive coefficient $\gamma c$ is set to 0.25 when the battery cell 20 is charged, and the adaptive coefficient $\gamma d$ is set to 0.14 when the battery cell 20 is discharged. These adaptive coefficients $\gamma c$ and $\gamma d$ are previously stored in the memory 31.

The processor 61 identifies, for the interval from the time (t-1) of the immediately previous calculation period to the time (t) of the present calculation period, a value of the correction coefficient $\beta_k$ based on the relationship between the measurement voltage deviation $\Delta V(t)$ and the measurement current deviation $\Delta I(t)$ when the measurement current Is changes greatly in accordance with the following equation [eq39]:

$$Vbv = \Delta V(t) - Rs \cdot \Delta I(t) = \frac{\alpha}{\gamma_v}T \cdot \sinh^{-1}(\beta_{map} \cdot \beta_k \cdot \gamma_i \cdot I(t)) - \frac{\alpha}{\gamma_v}T \cdot \sinh^{-1}(\beta_{map} \cdot \beta_k \cdot \gamma_i \cdot I(t-1)) \quad [\text{eq 39}]$$

In the equation [eq39], $\gamma v$ represents a first coefficient, which is an adaptive coefficient for defining scaling-up or scaling-down in the direction of the charge-transfer resistance voltage Vbv in the Butler-Volmer equation. $\gamma i$ also represents a second coefficient, which is an adaptive coefficient for defining scaling-up or scaling-down in the direction of the current I flowing through the battery cell 20a in the Butler-Volmer equation. The first coefficient $\gamma_v$ is basically equal to the second coefficient $\gamma_i$. However, because the second coefficient $\gamma_i$ is included as the independent variable of the inverse hyperbolic sine function in the equation [eq39], it is difficult to transform the equation [eq39] into a linear equation. This makes it difficult to identify the first and second coefficients $\gamma_v$ and $\gamma_i$ simultaneously. For this reason, the processor 61 according to the second embodiment is configured to identify the first coefficient $\gamma v$ at the time t, and, after lapse of one calculation period from the time t, apply the identified first coefficient $\gamma_v$ to the second coefficient $\gamma_i$.

In the equation [eq39], the parameters are expressed by the following equations [eq40]:

$$y_b(t) = \Delta V(t) - Rs \cdot \Delta I(t) \quad [\text{eq 40}]$$

$$\varphi_b^T(t) = \alpha \cdot T \cdot \sinh^{-1}(\beta_{map} \cdot \beta_k \cdot \gamma_i \cdot I(t)) - \alpha \cdot T \cdot \sinh^{-1}(\beta_{map} \cdot \beta_k \cdot \gamma_i \cdot I(t-1))$$

$$\theta_b(t) = \frac{1}{\gamma_v}(t)$$

Where $y_b$ represents an observed value. A model estimation value $y_{best}$ and an estimation error $\varepsilon b$ are expressed by the following equation [eq41]:

$$y_{best}(t) = \varphi_b^T(t)\theta_b(t-1)$$

$$\varepsilon_b(t) = y_b(t) - y_{best}(t) \quad [\text{eq41}]$$

The processor 61 successively identifies a value of the parameter estimation $\theta_b$ in accordance with the method of least squares based on the following equation [eq42] to correspondingly minimize the estimation error $\varepsilon_b$, and calculates the reciprocal of the parameter estimation $\theta_b$ to thereby calculate the first coefficient $\gamma_v$:

$$\theta_b(t) = \theta_b(t-1) + G_b(t)\varepsilon_b(t) \qquad [\text{eq 42}]$$

Where $$G_b(t) = \frac{P_b(t-1)\varphi_b(t)}{\lambda_b + \varphi_b^T(t)P_b(t-1)\varphi_b(t)}$$

$$P_b(t) = \frac{1}{\lambda_b}\left\{P_b(t-1) - \frac{P_b(t-1)\varphi_b(t)\varphi_b^T(t)P_b(t-1)}{\lambda_b + \varphi_b^T(t)P_b(t-1)\varphi_b(t)}\right\}$$

In the equation [eq42], Gb represents an adaptive gain, $P_b$ represents a covariance matrix, and $\lambda_b$ represents a forgetting factor.

When identifying the first coefficient $\gamma_v(t)$ at time t, the processor 61 applies the identified first coefficient $\gamma_v(t)$ to the second coefficient $\gamma_i(t+1)$ at time (t+1) after lapse of one calculation period since the time t in the following equation [eq43]:

$$\gamma_i(t+) = \gamma_v(t) \qquad [\text{eq43}]$$

Specifically, the second identifier 52 of the processor 61 calculates the observed value $y_b(t)$ as a function of the measurement voltage deviation $\Delta V(t)$, the measurement current deviation $\Delta I(t)$, and the DC resistance Rs. Then, the second identifier 52 sequentially identifies the parameter estimation $\theta_b$ in accordance with the method of least squares based on the equations [eq41] and [eq42] using, as an input value, the observed value $y_b(t)$. Thereafter, the second identifier 52 calculates the reciprocal of the parameter estimation 46 to thereby calculate the first coefficient $\gamma_v$. The second identifier 52 also applies the identified first coefficient $\gamma_v$ to the second coefficient $\gamma_i$.

Identification of the correction coefficient $\beta_k$ by the first identifier 51 is carried out upon the current I flowing through the battery cell 20a being small, i.e. smaller than a predetermined value. In contrast, identification of the first and second coefficients $\gamma_v$ and $\gamma_i$ by the second identifier 52 is carried out upon the current I flowing through the battery cell 20a being large, i.e. larger than the predetermined value.

From this viewpoint, the calculator 32 includes the selector 55 for selecting which of the charge-transfer resistance parameter $\beta$ and the adaptive coefficients $\gamma$ should be identified.

Figure 19:
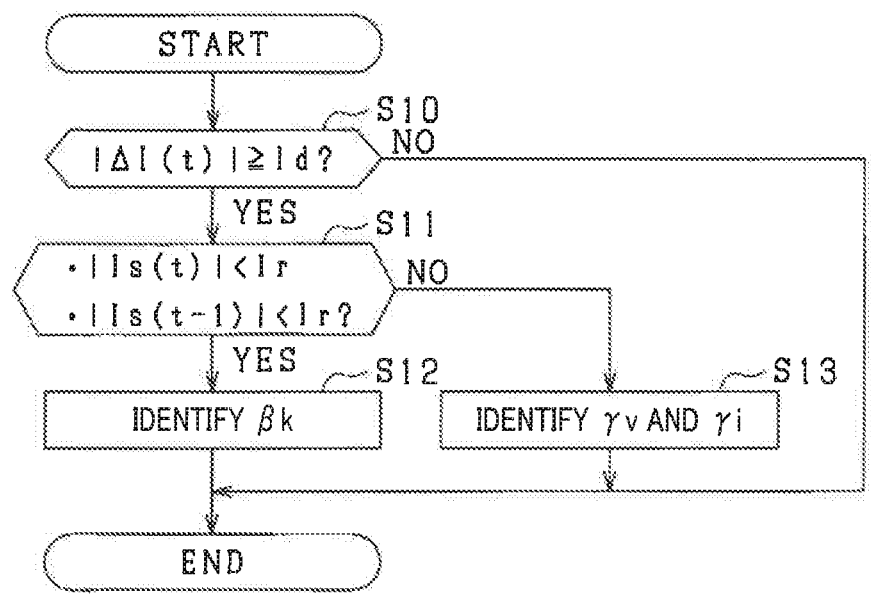
FIG. 19 is a flowchart schematically illustrating the procedure of a routine carried out by a selector according to the second embodiment of the present invention.

The following describes a selecting routine carried out by the processor 61 including the selector 55 with reference to FIG. 19. The processor 61 repeatedly carries out the selecting routine for, for example, the predetermined calculation period.

In step S10 of the selecting routine, the selector 55 determines whether the absolute value of the measurement current deviation $\Delta I(t)$ is equal to or more than a predetermined value Id. This operation is to determine whether there is a situation where each of the amount of change $\Delta OCV(t)$ and $\Delta Vw(t)$ is enabled to be ignored.

Upon the determination in step S10 being affirmative, the selecting routine proceeds to step S11. In step S11, the selector 55 determines whether the logical AND of a first condition and a second condition is true; the first condition is that the absolute value of the measurement current Is(t) at the present calculation period is lower than a threshold Ir, and the second condition is that the absolute value of the measurement current Is(t−1) at the immediately previous calculation period is lower than the threshold Ir. In other words, the selector 55 determines whether the first condition and second condition are both satisfied.

As illustrated in FIG. 16, the threshold Ir according to the second embodiment has a value corresponding to the half of a current range SI within which the Butler-Volmer equation expressed by the equation [eq9] can be approximated by the equation [eq31]. In particular, the threshold Ir is set to be larger as the cell temperature Ts is higher. The reason why the threshold Ir is set to be larger as the cell temperature Ts is higher is that the gradient of the Butler-Volmer equation illustrated in FIG. 5 when the current I flowing through the battery cell 20a is zero or thereabout is smaller as the temperature of the battery cell 20a is higher, so that the shape of the Butler-Volmer equation becomes more linear.

Upon the determination in step S11 being affirmative, the selecting routine proceeds to step S12. In step S12, the first identifier 51 identifies the correction coefficient $\beta_k$ in step S12. Otherwise, upon the determination in step S11 being negative, the selecting routine proceeds to step S13. In step S13, the first identifier 51 identifies the first and second coefficients $\gamma v$ and $\gamma i$.

The selecting routine enables the opportunity to identify the correction coefficient $\beta_k$ and the opportunity to identify the first and second coefficients $\gamma v$ and $\gamma i$ to be ensured.

Returning to FIG. 14, the correction coefficient $\beta_k$ and the first and second coefficients $\gamma v$ and $\gamma i$ identified by the parameter identifier 50 are input to the current estimator 35. The current estimator 35 updates the charge-transfer resistance parameter $\beta$ based on the correction coefficient $\beta_k$. Then, the current estimator 35 calculates the estimation current Ie based on the correction coefficient $\beta_k$ and the first and second coefficients $\gamma v$ and $\gamma i$.

Figure 20:
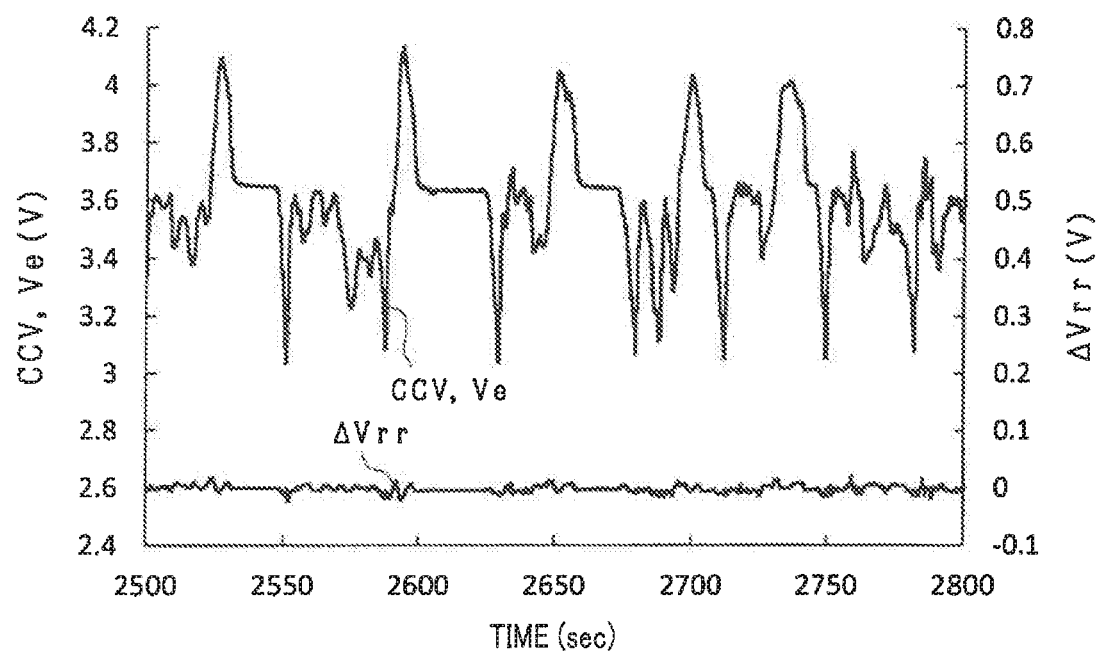
FIG. 20 is a graph schematically illustrating how a measurement value of the voltage across the battery cell, an estimated value of the voltage across the battery cell, and a deviation between the measurement value of the voltage across the battery cell and the estimated value of the voltage across the battery cell according to the second embodiment of the present invention.

FIG. 20 illustrates how the terminal voltage CCV, an estimated value Ve of the terminal voltage, and a deviation $\Delta Vrr$ between the terminal voltage CCV and the estimated value Ve are changed; these parameters CCV, Ve, and $\Delta Vrr$ are measured in a predetermined travelling mode of a vehicle to which the battery system 10 is applied to the vehicle. The estimated value Ve corresponds to the sum of 1. The open circuit voltage OCV calculated by the OCV converter 33
2. The DC resistance voltage Vs calculated by the Vs calculator 40
3. The charge-transfer resistance voltage Vbv calculated based on the updated charge-transfer resistance parameter $\beta$
4. The polarization voltage Vw calculated in accordance with the equation [eq13]

Note that the predetermined travelling mode in FIG. 20 is a LA #4 test cycle that is one of travelling patterns for measuring exhaust gas.

In particular, the example illustrated in FIG. 20 illustrates how the terminal voltage CCV, the estimated value Ve of the terminal voltage, and the deviation $\Delta Vrr$ between the terminal voltage CCV and the estimated value Ve are changed at low temperatures, such as −20° C., at which the deviation $\Delta Vrr$ is likely to increase. This enables the deviation $\Delta Vrr$ to be maintained at a very small level even at the low temperatures. For this reason, the transition of the terminal voltage CCV and the transition of the estimated value Ve are substantially overlapped with each other as illustrated in FIG. 20.

Figure 21:
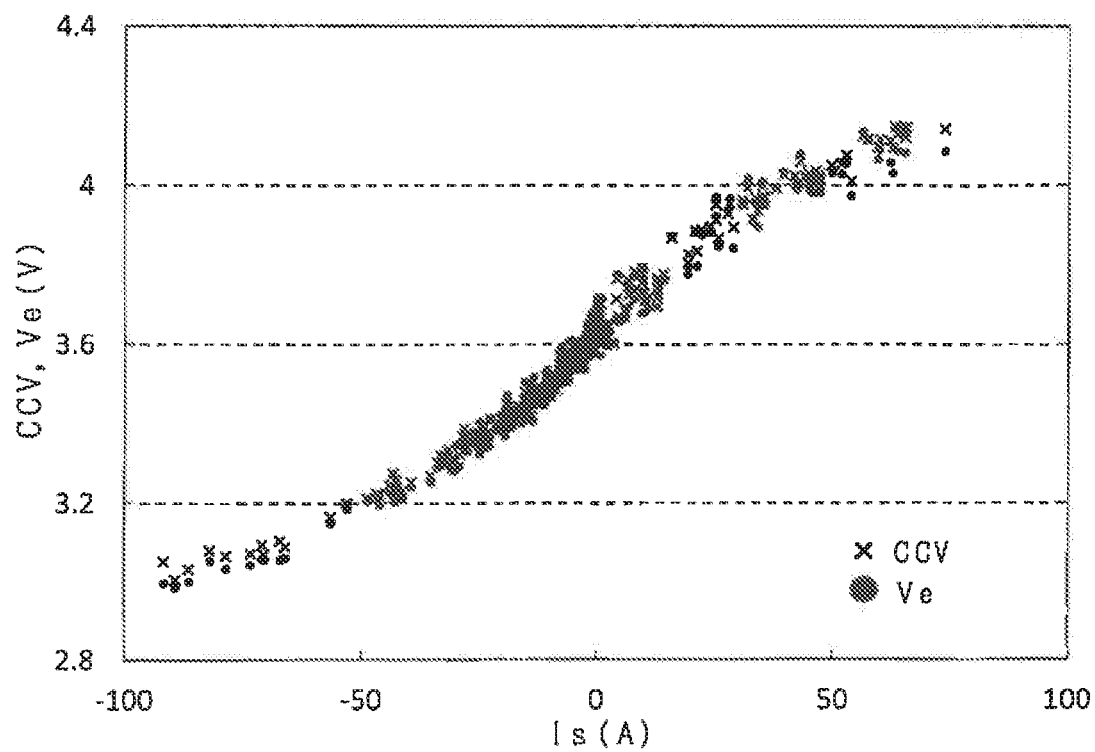
FIG. 21 is a graph schematically illustrating correlation between the measurement value of the voltage across the battery cell with respect to the measurement current and the estimated value of the voltage across the battery cell with respect to the measurement current according to the second embodiment of the present invention.

Note that FIG. 21 illustrates a graph of correlation among the measurement current Is, the estimated value Ve of the terminal voltage CCV, and the terminal voltage CCV during the data period illustrated in FIG. 20. As illustrated in FIG. 21, the second embodiment enables the nonlinear characteristics between the measurement current Is and the estimated value Ve of the terminal voltage CCV to be expressed with a higher accuracy, making it possible to estimate the terminal voltage CCV across the battery cell 20*a* with a higher accuracy. In contrast, the conventional battery model simply comprised of a resistor and a capacitor may make it difficult to express the nonlinear characteristics.

The second embodiment therefore properly updates the charge-transfer impedance model, resulting in an improvement of the calculation accuracy of the estimated voltage Ve of the terminal voltage CCV.

Modifications

Each of the embodiments described above can be modified as follows.

The first embodiment can directly identify the charge-transfer resistance parameter β in accordance with the following equation [eq44] in place of the equation [eq17] without using the correction coefficient $\beta_k$:

$$Is(t) - Is(t-1) = \qquad [\text{eq } 44]$$
$$\left[\frac{1}{\gamma}\sinh\left(\frac{\gamma}{\alpha}\cdot\frac{1}{T}Vbv(t)\right) - \frac{1}{\gamma}\sinh\left(\frac{\gamma}{\alpha}\cdot\frac{1}{T}Vbv(t-1)\right)\right] \times \frac{1}{\beta}$$

Where $\theta 1(t) = \frac{1}{\beta}$

The RC equivalent circuit model comprised of a parallel circuit including a resistor and a capacitor connected in parallel to the resistor is used as the diffusion impedance model 38*d*, but an RC equivalent circuit model comprised of such parallel circuits each including a resistor and a capacitor connected in parallel to the resistor can be used as the RC equivalent circuit.

The first embodiment estimates the SOC of the battery cell 20*a* as its state of the battery cell 20*a*, but estimation of the state of the battery cell 20*a* is not limited to estimation of the SOC of the battery cell 20*a*. For example, the maximum power dischargeable by the battery cell 20*a* for a predetermined time can be estimated, or the degree of deterioration of the battery cell 20*a* can be estimated.

In the first embodiment, the second learning routine is non-essential.

In the second embodiment, the initial parameter βmap can be stored in the memory 31 as part of the information VTI in the form of the equation [eq27].

In the second embodiment, the natural logarithm of the initial parameter βmap is mathematized in the form of the primary expression of the reciprocal of the cell temperature Ts, and is stored in the memory 31 as part of the information VTI, but the second embodiment is not limited thereto. For example, the natural logarithm of the initial parameter βmap can be mapped in the form of the primary expression of the reciprocal of the cell temperature Ts, and can be stored in the memory 31 as part of the information VTI. In this case, each calculator 32 can select, from natural logarithmic values of the stored initial parameter βmap, a natural logarithmic value corresponding to the battery temperature Ts. Then, each calculator 32 can transform the selected logarithmic value to the initial parameter βmap, and calculate, based on the initial parameter βmap and the relationship of "β=$\beta_k$× $\beta_{map}$" in the equation [eq29], the charge-transfer resistance parameter β.

Note that, if the structure that the natural logarithm of the initial parameter βmap is mapped in the form of the primary expression of the reciprocal of the cell temperature Ts is used, measuring at least three points of the cell temperature Ts enables the map to be created based on the measured values of the cell temperature Ts. For this reason, it is possible to easily identify the map.

A value of the threshold Ir when the battery cell 20*a* is charged can be different from a value of the threshold Ir when the battery cell 20*a* is discharged on condition that the above linearity at the current region at 0 A or thereabout is maintained. If the magnitude of the discharge current and the magnitude of the charge current for the battery cell 20*a* are different from each other, the first embodiment, which is satisfied at the current region at 0 A or thereabout, and the second identifier 52 according to the second embodiment can be combined with each other. Because the adaptive coefficient γc when the battery cell 20*a* is charged is usually different from the adaptive coefficient γd when the battery cell 20*a* is discharged, separately identifying the adaptive coefficient γc when the battery cell 20*a* and the adaptive coefficient γd when the battery cell 20*a* is discharged enables the identification accuracy to be improved.

The second embodiment can be configured to enable the opportunity to identify the first and second coefficients γv and γi to be ensured even if the operation in step S11 illustrated in FIG. 19 is affirmative.

In the second embodiment, the second learning unit 43 described in FIG. 6 of the first embodiment can learn the resistance Rw of the resistance component and the capacitance Cw of the capacitance component, which are used by the current estimator 35.

Other secondary battery cells, such as nickel hydride battery cells, can be used as the battery cells 20*a* in place of the lithium ion battery cells.

As the cell temperatures used by each routine described in the above embodiments, cell temperatures estimated based on any one of known battery temperature estimation methods can be used in place of the values measured by the temperature sensors 22.

The present invention is not limited to vehicles and can be applied to another apparatus.

REFERENCE SINS LIST

20*a*: Battery cell
30: Battery ECU
The invention claimed is:
1. A battery state estimating apparatus comprising:
an updating unit configured to perform a task of updating a charge-transfer impedance model included in a battery model of a secondary battery in accordance with an amount of change in a measurement value of a current flowing through the secondary battery,
the battery model comprising:
a DC resistance model representing a DC resistance of the secondary battery;
the charge-transfer impedance model representing a charge-transfer impedance of the secondary battery and including a charge-transfer resistance parameter (β) that is correlated with an exchange current density, the charge-transfer impedance model being derived from the Butler-Volmer equation; and
a diffusion impedance model being an RC equivalent circuit model comprising a parallel circuit that includes a resistance and a capacitance connected in parallel to each other, the diffusion impedance model representing a diffusion impedance of the secondary battery, the DC resistance model, the charge-transfer impedance model, and the diffusion impedance model being connected in series to each other, the task of updating the transfer impedance model being configured to cause a first relationship between the current flowing through the secondary battery and a voltage across the charge-transfer resistance to approach a second relationship between an actual value of the current flowing through the secondary battery and an actual value of the voltage across the charge-transfer resistance, the first relationship between the current flowing through the secondary battery and the voltage across the charge-transfer resistance being defined based on the Butler-Volmer equation; and a state estimator configured to estimate a state of the secondary battery based on the battery model including the updated charge-transfer impedance model.

2. The battery state estimating apparatus according to claim 1, wherein the updating unit is configured to estimate the charge-transfer impedance model at a predetermined calculation period, and the state estimator is configured to estimate the state of the secondary battery at the predetermined calculation period, the battery state estimating apparatus further comprising:

a first deviation calculator configured to calculate, as a first deviation, a deviation between a measurement value of the current flowing through the secondary battery at a present calculation period and a measurement value of the current flowing through the secondary battery at an immediately previous calculation period;

a second deviation calculator configured to calculate, as a second deviation, any one of:

an estimation current deviation between an estimation current flowing through the secondary battery and being estimated from the charge-transfer impedance model at the present calculation period, and an estimation current flowing through the secondary battery and being estimated from the charge-transfer impedance model at the immediately previous calculation period; and a value depending on the estimation current deviation; and a parameter estimator configured to estimate, based on the first and second deviations, a correction coefficient ($\beta_k$) for causing the second deviation to approach the first deviation in accordance with a method of iterative least squares, the updating unit being configured to perform, as the task of updating the charge-transfer resistance parameter ($\beta$), a task of updating, based on the correction coefficient estimated by the parameter estimator, the charge-transfer resistance parameter ($\beta$).

3. The battery state estimating apparatus according to claim 2, wherein the charge-transfer resistance parameter ($\beta$) is a parameter satisfying the following first equation:

$$I = \frac{1}{\gamma} \cdot \frac{1}{\beta} \sinh\left(\frac{\gamma}{\alpha} \cdot \frac{1}{T} Vbv\right) \quad \text{[first equation]}$$

Where:
$\alpha$ is a constant;
$\gamma$ is a constant;

I is the current flowing through the secondary battery;
T is a temperature of the secondary battery; and
Vbv is the voltage across the charge-transfer resistance.

4. The battery state estimating apparatus according to claim 3, wherein:

the second deviation calculator calculates the second deviation at the present calculation period in accordance with the following second equation:

$$\Delta F(t) = \left[\frac{1}{\gamma} \cdot \frac{1}{\beta} \sinh\left(\frac{\gamma}{\alpha} \cdot \frac{1}{T} Vbv(t)\right) - \frac{1}{\gamma} \cdot \frac{1}{\beta} \sinh\left(\frac{\gamma}{\alpha} \cdot \frac{1}{T} Vbv(t-1)\right)\right] \quad \text{[second equation]}$$

Where:
$\Delta F(t)$ represents the second deviation at the present calculation period;
$Vbv(t)$ is the voltage across the charge-transfer resistance at the present calculation period; and
$Vbv(t-1)$ is the voltage across the charge-transfer resistance at the immediately previous calculation period;

the parameter estimator is configured to estimate the correction coefficient ($\beta_k$) for causing the first deviation to approach the second deviation in accordance with the method of iterative least squares, the second deviation being defined in accordance with the following third equation:

$$\left[\frac{1}{\gamma} \cdot \frac{1}{\beta} \sinh\left(\frac{\gamma}{\alpha} \cdot \frac{1}{T} Vbv(t)\right) - \frac{1}{\gamma} \cdot \frac{1}{\beta} \sinh\left(\frac{\gamma}{\alpha} \cdot \frac{1}{T} Vbv(t-1)\right)\right] \times \frac{1}{\beta_k} \quad \text{[third equation]}$$

Where:
$\beta_0$ is a constant; and
$\beta_k$ is the correction coefficient.

5. The battery state estimating apparatus according to claim 4, wherein the second deviation calculator is configured to subtract, from a measurement value of a voltage across the secondary battery, a voltage across the DC resistance to calculate the voltage across the charge-transfer impedance on condition that the amount of change in the measurement value of the current flowing through the secondary during one calculation period is equal to or more than a predetermined value.

6. The battery state estimating apparatus according to claim 2, wherein:

the parameter estimator is a first parameter estimator, and the updating unit is a first updating unit, the battery state estimating apparatus further comprising:
a second parameter estimator configured to estimate a resistance value of the resistance of the RC equivalent circuit and a capacitance of the capacitor of the RC equivalent circuit in accordance with a model, the model comprising the parallel circuit constituting the RC equivalent circuit model and an error resistance connected in series to the parallel circuit; and a second updating unit configured to update an actual resistance value of the resistance of the RC equivalent circuit and an actual capacitance of the capacitor of the RC equivalent circuit respectively based on the estimated resistance value of the resistance of the RC equivalent circuit and the estimated capacitance of the capacitor of the RC equivalent circuit.

7. The battery state estimating apparatus according to claim 1, wherein:
the Butler-Volmer equation includes a first coefficient ($\gamma_v$) for defining scaling-up or scaling-down in a direction of the charge-transfer resistance voltage in the Butler-Volmer equation, and a second coefficient ($\gamma_i$) for defining scaling-up or scaling-down in a direction of the current flowing through the battery cell in the Butler-Volmer equation, the battery state estimating apparatus further comprising:
a first identifier configured to identify, based on the amount of change in the measurement value of the current flowing through the secondary battery and an amount of change in a voltage across the secondary battery, the charge-transfer resistance parameter as a correlation value of a gradient of a primary expression in accordance with a method of iterative least squares on condition that an absolute value of the measurement value of the current flowing through the secondary battery is lower than a predetermined threshold, the primary expression defining the first relationship between the current flowing through the secondary battery and the voltage across the charge-transfer resistance; and
a second identifier configured to:
identify, based on the amount of change in the measurement value of the current flowing through the secondary battery and the amount of change in the voltage across the secondary battery, the first identifier at a calculation period in accordance with the method of iterative least squares; and
apply the identified first coefficient to the second coefficient at a next calculation period immediately after the calculation period at which the first identifier was identified,
the updating unit being configured to perform, as the task of updating, a task of updating the charge-transfer impedance model as a function of both:
the charge-transfer resistance parameter identified by the first identifier, and
the first and second coefficients identified by the second identifier.

8. The battery state estimating apparatus according to claim 7, wherein the charge-transfer resistance parameter is a parameter defining the first relationship between the current flowing through the secondary battery and the voltage across the charge-transfer resistance in an inverse hyperbolic sine function,
the inverse hyperbolic sine function having the current flowing through the battery cell as an independent variable, and having the voltage across the charge-transfer resistance as a dependent variable,
the charge-transfer resistance parameter being defined based on an exponential function having a reciprocal of the temperature of the secondary battery as an independent variable.

9. The battery state estimating apparatus according to claim 8, wherein the charge-transfer parameter, the first coefficient, and the second coefficient are parameters satisfying the following fourth equation:

$$Vbv = \frac{\alpha}{\gamma_v} T \cdot \sinh^{-1}(\beta \cdot \gamma_i \cdot I) \quad \text{[fourth equation]}$$

Where:
β represents the charge-transfer parameter,
$\gamma_v$ represents the first coefficient;
$\gamma_i$ represents the second coefficient;
α represents a constant;
I represents the current flowing through the secondary battery;
T represents the temperature of the secondary battery; and
Vbv represents the voltage across the charge-transfer resistance.

10. The battery state estimating apparatus according to claim 9, wherein:
a linear approximate expression is defined by applying Maclaurin expansion to the fourth equation with respect to the current flowing through the secondary battery, the linear approximate expression having the current flowing through the secondary battery as an independent variable, and having the voltage across the charge-transfer resistance as a dependent variable; and
the threshold is set based on a range of the current within which the voltage across the charge-transfer resistance expressed by the fourth equation is enabled to be approximated by the voltage across the charge-transfer resistance defined by the approximate expression, the battery state estimating apparatus further comprising:
a storage unit storing information associated with the charge-transfer resistance parameter being correlated with the temperature of the secondary battery; and
a calculator configured to calculate, based on a measurement value of the temperature of the secondary battery and the information associated with the charge-transfer resistance parameter stored in the storage unit, information corresponding to the measurement value of the temperature of the secondary battery included in the information associated with the charge-transfer resistance parameter,
the first identifier further comprising:
a correction coefficient identifier configured to identify, based on the amount of change in the measurement value of the current and the amount of change in the voltage across the secondary battery, a correction coefficient in accordance with the method of iterative least squares, the correction coefficient satisfying the following fifth equation:

$$\Delta Vbv = (\alpha \cdot T \cdot \beta_{map} \cdot \Delta I) \times \beta_k \quad \text{[fifth equation]}$$

Where:
$\beta_{map}$ represents the information associated with the charge-transfer resistance parameter;
ΔVbv represents an amount of change in the voltage across the charge-transfer resistance;
ΔI represents the amount of change in the measurement value of the current; and
$\beta_k$ represents the correction coefficient; and
a correction unit configured to correct, based on the identified correction coefficient, the information corresponding to the measurement value of the temperature of the secondary battery included in the information associated with the charge-transfer resistance parameter.

11. The battery state estimating apparatus according to claim 10, wherein:
the information $\beta_{map}$ associated with the charge-transfer resistance parameter is the charge-transfer resistance parameter that has been identified, and is an initial parameter expressed by the following sixth equation:

$$\beta = \beta_k = \beta_{map} \quad \text{[sixth equation]}$$

the storage unit is configured to store the initial parameter that is correlated with the reciprocal of the temperature of the secondary battery in accordance with the following seventh equation:

$$\ln(\beta_{map}) = \frac{K_t}{T_s} + \ln(\beta 0) \qquad \text{[seventh equation]}$$

Where $K_t$ is a constant, and $\beta 0$ is a constant.

12. The battery state estimating apparatus according to claim 11, wherein:
the second identifier is configured to identify the first coefficient ($\gamma_v$) using the method of iterative least squares, the first coefficient ($\gamma_v$) satisfying the following eighth equation:

$$\Delta Vbv(t) = [\alpha \cdot T \cdot \sinh^{-1}(\beta_{map} \cdot \beta_k \cdot \gamma_i \cdot I(t)) - \\ \alpha \cdot T \cdot \sinh^{-1}(\beta_{map} \cdot \beta_k \cdot \gamma_i \cdot I(t-1))] \times \frac{1}{\gamma_v} \qquad \text{[eighth equation]}$$

Where:
I(t) represents the measurement value of the current at a present calculation period; and
I(t−1) represents the measurement value of the current at an immediately previous calculation period.

13. The battery state estimating apparatus according to claim 10, wherein:
the first identifier is configured to identify the correction coefficient on condition that the amount of change in the measurement value of the current during one calculation period is equal to or more than a predetermined value; and
the second identifier is configured to identify the first coefficient on condition that the amount of change in the measurement value of the current during one calculation period is equal to or more than the predetermined value.

14. The battery state estimating apparatus according to claim 13, wherein:
the first identifier is configured to identify the correction coefficient in accordance with the method of iterative least squares using an observed value expressed by the following ninth equation:

$$y(t) = \Delta V(t) - Rs \cdot \Delta I(t) \qquad \text{[ninth equation]}$$

Where:
y(t) represents the observed value; and
Rs represents the DC resistance; and
the second identifier is configured to identify the first coefficient in accordance with the method of iterative least squares using the observed value expressed by the above ninth equation.

15. The battery state estimating apparatus according to claim 7, wherein:
the second identifier is configured to identify the first coefficient on condition that the absolute value of the measurement value of the current flowing through the secondary battery is equal to or more than the predetermined threshold.

\* \* \* \* \*

UNITED STATES PATENT AND TRADEMARK OFFICE
CERTIFICATE OF CORRECTION

PATENT NO. : 10,663,524 B2
APPLICATION NO. : 15/556138
DATED : May 26, 2020
INVENTOR(S) : Toshiyuki Kawai et al.

It is certified that error appears in the above-identified patent and that said Letters Patent is hereby corrected as shown below:

On the Title Page

Item (30):
Delete "Nov. 26, 2015  (JP).......................... 2015-231112"
Insert --Nov. 26, 2015  (JP).......................... 2015-231112
         Mar. 6, 2015   (JP).......................... 2015-045161--

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*